US011211441B2

(12) United States Patent
Jeong et al.

(10) Patent No.: US 11,211,441 B2
(45) Date of Patent: Dec. 28, 2021

(54) ORGANIC LIGHT EMITTING DISPLAY DEVICE AND METHOD OF MANUFACTURING ORGANIC LIGHT EMITTING DISPLAY DEVICE

(71) Applicant: Samsung Display Co., LTD., Yongin-si (KR)

(72) Inventors: Yu-Gwang Jeong, Anyang-si (KR); Subin Bae, Hwaseong-si (KR); Joongeol Lee, Wanju-Gun (KR); Sanggab Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/199,226

(22) Filed: Nov. 26, 2018

(65) Prior Publication Data

US 2019/0165073 A1 May 30, 2019

(30) Foreign Application Priority Data

Nov. 27, 2017 (KR) ........................ 10-2017-0159644

(51) Int. Cl.
*H01L 27/32* (2006.01)
*H01L 51/50* (2006.01)

(52) U.S. Cl.
CPC ...... *H01L 27/3265* (2013.01); *H01L 27/3246* (2013.01); *H01L 27/3258* (2013.01); *H01L 51/5012* (2013.01); *H01L 27/3262* (2013.01); *H01L 2227/323* (2013.01)

(58) Field of Classification Search
CPC ............. H01L 27/3265; H01L 27/3258; H01L 51/5012; H01L 27/3246; H01L 27/3262; H01L 2227/323; H01L 27/1255; H01L 29/78645; H01L 27/124; H01L 51/56
See application file for complete search history.

(56) References Cited

U.S. PATENT DOCUMENTS 8,772,777 B2 7/2014 Lee et al.
9,502,572 B2 11/2016 Yamazaki
(Continued)

FOREIGN PATENT DOCUMENTS

KR 10-2012-0061312 6/2012
KR 10-2013-0075657 7/2013

*Primary Examiner* — Su C Kim
(74) *Attorney, Agent, or Firm* — H.C. Park & Associates, PLC

(57) ABSTRACT

An OLED device includes a substrate, a first active layer, a first gate electrode, a second gate electrode, first source and first drain electrodes, a first high dielectric constant (high-k) insulation structure, and a light emitting structure. The substrate has a first region and a second region. The first active layer is disposed in the first region on the substrate. The first gate electrode is disposed on the first active layer, and has a first thickness. The second gate electrode is disposed on the first gate electrode. The first source electrode and first drain electrode are disposed on the second gate electrode, and constitutes a first semiconductor element together with the first active layer and the first gate electrode. The first high-k insulation structure is disposed between the first gate electrode and the second gate electrode, and is spaced apart from the first source electrode and first drain electrode.

17 Claims, 21 Drawing Sheets

(56) References Cited

U.S. PATENT DOCUMENTS

| | | | | |
|---|---|---|---|---|
| 2008/0203477 | A1* | 8/2008 | Yamazaki | H01L 27/1214 257/347 |
| 2008/0283839 | A1* | 11/2008 | Watanabe | H01L 21/84 257/66 |
| 2015/0102349 | A1* | 4/2015 | Lee | H01L 27/1288 257/71 |
| 2016/0148986 | A1* | 5/2016 | Lee | H01L 29/78696 345/694 |

* cited by examiner

ORGANIC LIGHT EMITTING DISPLAY DEVICE AND METHOD OF MANUFACTURING ORGANIC LIGHT EMITTING DISPLAY DEVICE

CROSS-REFERENCE TO RELATED APPLICATION

This application claims priority from and the benefit of Korean Patent Application No. 10-2017-0159644, filed on Nov. 27, 2017, which is hereby incorporated by reference for all purposes as if fully set forth herein.

BACKGROUND

Field

Exemplary embodiments relate generally to organic light emitting display devices and method of manufacturing the organic light emitting display device. More particularly, embodiments of the present inventive concept relate to organic light emitting display devices including a high dielectric constant insulation structure and method of manufacturing the organic light emitting display device including the high dielectric constant insulation structure.

Discussion of the Background

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device.

Recently, an OLED display device with ultra-high definition (UHD) using a high dielectric constant (high-k) insulation layer has been developed. As a size of the OLED device becomes smaller, an area of a storage capacitor included in the OLED device may be reduced, and it becomes difficult to ensure the capacitance of a storage capacitor. Thus, the high-k insulation layer may be used as a dielectric layer of the storage capacitor to ensure the capacitance. However, when the high-k insulation layer is used, a defect of a contact hole may occur due to a low selectivity ratio of the high-k insulation layer, a gate insulation layer, and an active layer in a process for forming the contact hole.

The above information disclosed in this Background section is only for understanding of the background of the inventive concepts, and, therefore, it may contain information that does not constitute prior art.

SUMMARY

Some exemplary embodiments provide an organic light emitting display (OLED) device including a high dielectric constant insulation structure.

Some exemplary embodiments provide a method of manufacturing an OLED device including a high dielectric constant insulation structure.

According to some exemplary embodiments, an OLED device includes a substrate, a first active layer, a first gate electrode, a second gate electrode, first source and first drain electrodes, a first high dielectric constant (high-k) insulation structure, and a light emitting structure. The substrate has a first region and a second region that is located adjacent to the first region. The first active layer is disposed in the first region on the substrate. The first gate electrode is disposed on the first active layer, and has a first thickness. The second gate electrode is disposed on the first gate electrode. The first source electrode and first drain electrode are disposed on the second gate electrode, and constitutes a first semiconductor element together with the first active layer and the first gate electrode. The first high-k insulation structure is disposed between the first gate electrode and the second gate electrode, and is spaced apart from the first source electrode and first drain electrode. The light emitting structure is disposed on the first source electrode and first drain electrode.

According to some exemplary embodiments, a method of manufacturing an OLED device is provided as follows. A substrate having a first region and a second region that is located adjacent to the first region is provided. First and second active layers are formed in the first and second regions on the substrate. First and third gate electrodes are formed on the first and second active layers, and the first and third gate electrodes have a first thickness. A preliminary high-k insulation structure is formed on the entire substrate such that the first gate electrode and the third gate electrode are covered. A preliminary second gate electrode layer is formed on the entire preliminary high-k insulation structure. A second gate electrode located on the first gate electrode, a first high-k insulation structure interposed between the first and second gate electrodes, and a second gate electrode having a second thickness less than the first thickness are formed by selectively etching the preliminary second electrode layer. A light emitting structure is formed on the second gate electrode.

According to some exemplary embodiments, an organic light emitting display (OLED) device includes a substrate, a semiconductor element, a storage capacitor, a high-k insulation structure, and a light emitting structure. The substrate has a semiconductor element region and a capacitor region that is located to the semiconductor element region. The semiconductor element is disposed in the semiconductor element region on the substrate, and includes an active layer, a gate electrode having a first thickness, and source and drain electrodes. The storage capacitor is disposed in the capacitor region on the substrate, and includes a first conductive pattern having a second thickness greater than the first thickness and a second conductive pattern disposed on the first conductive pattern. The high-k insulation structure is interposed between the first and second conductive patterns. The light emitting structure is disposed on the semiconductor element and the capacitor.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
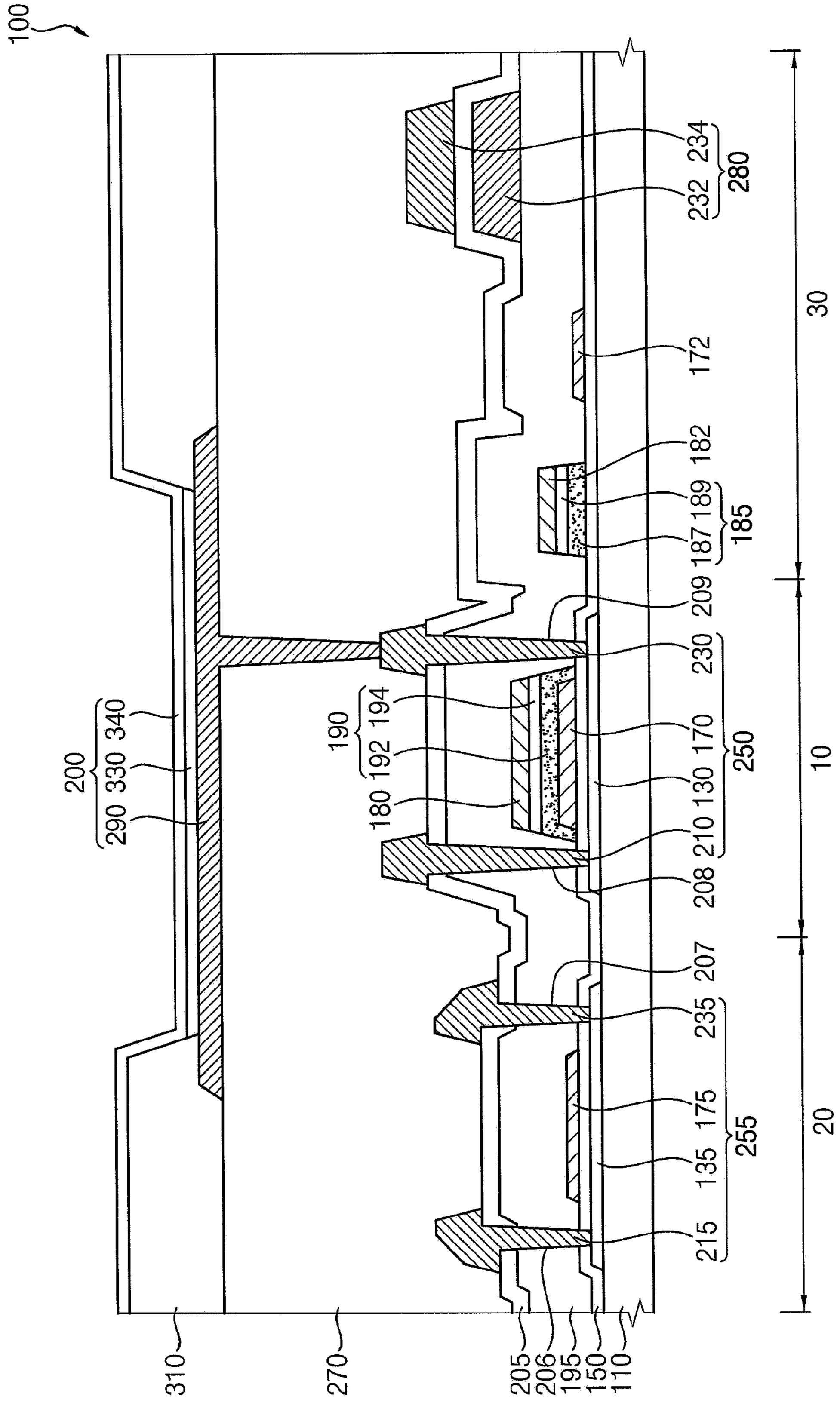
FIG. 1 is a cross-sectional view illustrating an organic light emitting display (OLED) device in accordance with exemplary embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, embodiments of the present inventive concept will be explained in detail with reference to the accompanying drawings.

Figure 2:
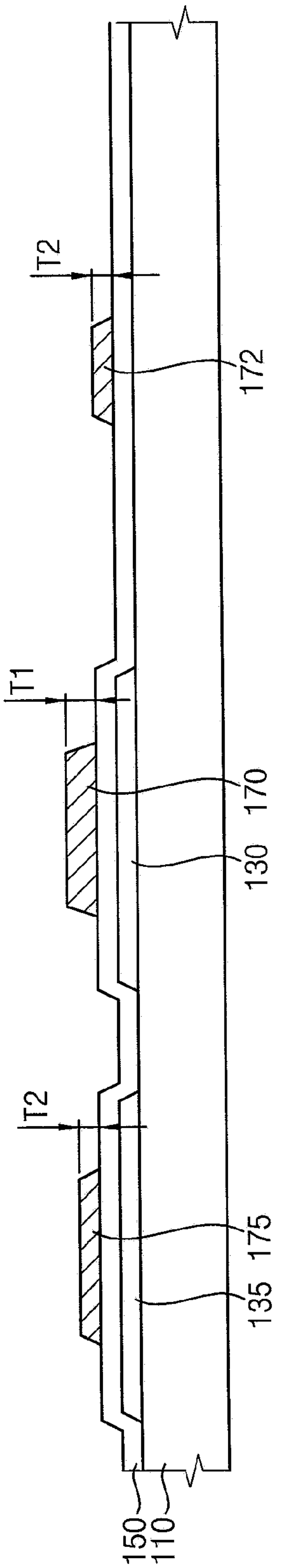
FIG. 2 is a cross-sectional view for comparing a thickness of a first gate electrode and thicknesses of a third gate electrode and a first gate electrode pattern of FIG. 1.

FIG. 1 is a cross-sectional view illustrating an organic light emitting display (OLED) device in accordance with exemplary embodiments, and FIG. 2 is a cross-sectional view for comparing a thickness of a first gate electrode and thicknesses of a third gate electrode and a first gate electrode pattern of FIG. 1.

Referring to FIGS. 1 and 2, an organic light emitting display (OLED) device 100 may include a substrate 110, a gate insulation layer 150, a first high dielectric constant (high-k) insulation structure 190, a second high-k insulation structure 185, a first semiconductor element 250, a second semiconductor element 255, a second gate electrode 180, a first gate electrode pattern 172, a second gate electrode pattern 182, a first insulating interlayer 195, a light emitting structure 200, a second insulating interlayer 205, a first electrode pattern 232, a second electrode pattern 234, a planarization layer 270, a pixel defining layer 310, etc. Here, the first high-k insulation structure 190 may include a first high-k insulation layer pattern 192 and a first insulation layer pattern 194. In addition, the first semiconductor element 250 may include a first active layer 130, a first gate electrode 170, a first source electrode 210, and a first drain electrode 230, and the second semiconductor element 255 may include a second active layer 135, a third gate electrode 175, a second source electrode 215, and a second drain electrode 235. Further, the second high-k insulation structure 185 may include a second high-k insulation layer pattern 187 and a second insulation layer pattern 189, and the light emitting structure 200 may include a lower electrode 290, a light emitting layer 330, and an upper electrode 340. The first gate electrode 170 and the second gate electrode 180 may serve as a first capacitor, and the first electrode pattern 232 and the second electrode pattern 234 may be defined as a second capacitor 280.

When OLED device 100 includes the first high-k insulation structure 190, the OLED device 100 may include a first capacitor having a high dielectric constant. Accordingly, the OLED device 100 may serve as an OLED device including the first capacitor capable of securing a relatively large capacitance. Here, the term 'high dielectric constant' means that the dielectric constant K is 8 or more.

The substrate 110 may be provided. The substrate 110 may include transparent or opaque materials. For example, the substrate 110 may include a quartz substrate, a synthetic quartz substrate, a calcium fluoride substrate, a fluoride-doped quartz substrate, a sodalime glass substrate, a non-alkali glass substrate etc. Alternatively, the substrate 110 may include a flexible transparent material such as a flexible transparent resin substrate (e.g., a polyimide substrate). In this case, the polyimide substrate may include a first polyimide layer, a barrier film layer, a second polyimide layer, etc. For example, the polyimide substrate may have a structure in which the first polyimide layer, the barrier film layer and the second polyimide layer are stacked on a rigid glass substrate. In a manufacturing process of the OLED device 100, after an insulation layer (e.g., a buffer layer) is provided on the second polyimide layer of the polyimide substrate, an upper structure (e.g., the first semiconductor element 250, the second semiconductor element 255, the first capacitor, the first drain electrode 230, the light emitting structure 200, etc.) is disposed. After the upper structure is formed on the buffer layer, the rigid glass substrate on which the polyimide substrate is formed may be removed. That is, since the polyimide substrate is relatively thin and flexible, it may be difficult to directly form the upper structure on the polyimide substrate. In this regard, as the rigid glass substrate is removed after the upper structure is formed by using the rigid glass substrate to help support the formation of the upper structure, the polyimide substrate may serve as the substrate 110. In exemplary embodiments, the substrate 110 may have a first region 10, a second region 20, and a third region 30. For example, the second region 20 may be located between the first region 10 and the second region 20, and the first region 10 may be spaced apart from the third region 30.

A buffer layer (not shown) may be disposed on the substrate 110. The buffer layer may be disposed on the entire substrate 110. The buffer layer may prevent the diffusion of metal atoms and/or impurities from the substrate 110 into the first semiconductor element 250, the second semiconductor element 255, the first capacitor, the second capacitor 280, and the light emitting structure 200. In addition, the buffer layer may control a rate of a heat transfer in a crystallization process for forming the active layer 130, thereby obtaining substantially uniform active layer 130. Further, the buffer layer may improve a surface flatness of the substrate 110 when a surface of the substrate 110 is relatively irregular. In some exemplary embodiments, according to a type of the substrate 110, at least two buffer layers may be provided on the substrate 110, or the buffer layer may not be disposed. For example, the buffer layer may include organic materials or inorganic materials.

The first active layer 130 may be disposed in the first region 10 on the substrate 110. For example, the first active layer 130 may include an oxide semiconductor, an inorganic semiconductor (e.g., amorphous silicon, polysilicon, etc.), an organic semiconductor, etc.

The second active layer 135 may be disposed in the second region 20 on the substrate 110. The second active layer 135 may include an oxide semiconductor, an inorganic semiconductor, an organic semiconductor, etc. In exemplary embodiments, the first active layer 130 and the second active layer 135 may be located at the same layer (or same level), and may be simultaneously (or concurrently) formed using the same materials.

The gate insulation layer 150 may be disposed on the first active layer 130, the second active layer 135, and the substrate 110. The gate insulation layer 150 may cover the first active layer 130 and the second active layer 135 on the substrate 110, and may be disposed on the entire substrate 110. For example, the gate insulation layer 150 may cover the first and second active layers 130 and 135 on the substrate 110, and may be disposed as a substantially uniform thickness along a profile of the first and second active layers 130 and 135. Alternatively, the gate insulation layer 150 may sufficiently cover the first and second active layers 130 and 135 on the substrate 110, and may have a substantially flat upper surface without a step around the first and second active layers 130 and 135. The gate insulation layer 150 may include silicon compound, metal oxide, etc.

The first gate electrode 170 may be disposed in the first region 10 on the gate insulation layer 150. The first gate electrode 170 may be disposed on a portion of the gate insulation layer 150 under which the first active layer 130 is located. In exemplary embodiments, as illustrated in FIG. 2, the first gate electrode 170 may have a first thickness T1. The first gate electrode 170 may include a metal, a metal alloy, metal nitride, conductive metal oxide, transparent conductive materials, etc. For example, the first gate electrode 170 may include gold (Au), silver (Ag), aluminum (Al), platinum (Pt), nickel (Ni), titanium (Ti), palladium (Pd), magnesium (Mg), Calcium (Ca), Lithium (Li), chrome (Cr), tantalum (Ta), tungsten (W), copper (Cu), molybdenum (Mo), scandium (Sc), neodymium (Nd), Iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. Alternatively, the first gate electrode 170 may have a multi-layered structure.

The third gate electrode 175 may be disposed in the second region 20 on the gate insulation layer 150. The third gate electrode 175 may be disposed on a portion of the gate insulation layer 150 under which the second active layer 135 is located. In exemplary embodiments, as illustrated in FIG. 2, the third gate electrode 175 may have a second thickness T2 that is less than the first thickness T1. For example, a portion of the third gate electrode 175 and a portion of the first gate electrode pattern 172 may be removed in a process performing an etching process for forming the first gate electrode 170, the second gate electrode pattern 182, the first high-k insulation structure 190, and the second high-k insulation structure 185, and a thickness of each of the third gate electrode 175 and the first gate electrode pattern 172 may be relatively reduced. Thus, a thickness of each of the third gate electrode 175 and the first gate electrode pattern 172 may be less than a thickness of the first gate electrode 170. The third gate electrode 175 may include a metal, a metal alloy, metal nitride, conductive metal oxide, transparent conductive materials, etc. These may be used alone or in a suitable combination thereof. Alternatively, the third gate electrode 175 may have a multi-layered structure.

The first gate electrode pattern 172 may be disposed in the third region 30 on the gate insulation layer 150. In exemplary embodiments, the first gate electrode pattern 172 may have the second thickness T2. The first gate electrode pattern 172 may serve as a wiring. For example, the first gate electrode pattern 172 may include a data signal wiring providing a data signal, a gate signal wiring providing a gate signal, an initialization signal wiring providing an initialization signal, an emission signal wiring providing an emission signal, a power supply voltage wiring providing a power supply voltage, etc. The first gate electrode pattern 172 may include a metal, a metal alloy, metal nitride, conductive metal oxide, transparent conductive materials, etc. These may be used alone or in a suitable combination thereof. Alternatively, the first gate electrode pattern 172 may have a multi-layered structure. In exemplary embodiments, the first gate electrode 170, the third gate electrode 175, and the first gate electrode pattern 172 may be located at the same layer, and may be simultaneously formed using the same materials.

The first high-k insulation structure 190 may be disposed in the first region 10 on the first gate electrode 170. In exemplary embodiments, the first high-k insulation structure 190 may completely cover the first gate electrode 170. For example, as the first high-k insulation structure 190 completely covers the first gate electrode 170, the first gate electrode 170 may be protected in a process for etching the second gate electrode 180. In addition, the first high-k insulation structure 190 may be spaced apart from the first source electrode 210 and the first drain electrode 230. In other words, the first high-k insulation structure 190 may not be in direct contact with the first source electrode 210 and the first drain electrode 230.

For example, in a process for forming a contact hole such that the first source electrode 210 and the first drain electrode 230 are in contact with the first active layer 130, when the first high-k insulation layer pattern 192 together with the second insulating interlayer 205 and the first insulating interlayer 195 is removed after the first high-k insulation structure 190 is formed on the entire gate insulation layer 150, an etching process may be performed using $BCl_2$ gas or $Cl_2$ gas due to the first high-k insulation layer pattern 192. In this case, a defect of the contact hole may occur because of a low selectivity ratio of the first active layer 130, the gate insulation layer 150, and the first high-k insulation structure 190. In other words, the first active layer 130 may not be exposed or may be completely removed in the etching process for forming the contact hole. Accordingly, to readily form the contact hole, the first high-k insulation structure 190 may be spaced apart from the contact hole such that the first high-k insulation structure 190 is not removed in the etching process for forming the contact hole. That is, the first high-k insulation structure 190 may be spaced apart from the first source and first drain electrodes 210 and 230.

In exemplary embodiments, the first high-k insulation structure 190 may include the first high-k insulation layer pattern 192 covering the first gate electrode 170 and the first insulation layer pattern 194 disposed on the first high-k insulation layer pattern 192. Here, the first high-k insulation layer pattern 192 may be in direct contact with an upper surface of the first gate electrode 170, and the first insulation layer pattern 194 may be simultaneously in contact with a lower surface of the second gate electrode 180 and an upper surface of the first high-k insulation layer pattern 192. In addition, the first insulation layer pattern 194 may have a relatively low dielectric constant (or permittivity) less than the first high-k insulation layer pattern 192. When the first high-k insulation structure 190 includes the first insulation layer pattern 194, a leakage current of the first capacitor may be reduced because a distance between the first gate electrode 170 and the second gate electrode 180 is increased. In addition, a thickness of the first high-k insulation layer pattern 192 and a thickness of the first insulation layer pattern 194 may be determined according to a capacitance required of the first capacitor. In exemplary embodiments, a thickness of the first high-k insulation layer pattern 192 may be greater than a thickness of the first insulation layer pattern 194.

The first high-k insulation layer pattern 192 may include metal oxide having a high dielectric constant. For example, the first high-k insulation layer pattern 192 may include aluminium oxide (or alumina (AlxOy)), zirconium oxide (ZrOx), hafnium oxide (HfOx), titanium oxide (TiOx), etc. In addition, the first insulation layer pattern 194 may include silicon compound, metal oxide, etc. For example, the first insulation layer pattern 194 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. Accordingly, the first high-k insulation structure 190 including the first high-k insulation layer pattern 192 and the first insulation layer pattern 194 may be constituted. In other words, when the first insulation layer pattern 194 and the first high-k insulation layer pattern 192 have the same materials, the first high-k insulation structure 190 may be formed as a single layer.

The second high-k insulation structure 185 may be disposed in the third region 30 on the gate insulation layer 150. In exemplary embodiments, the second high-k insulation structure 185 may be spaced apart from the first high-k insulation structure 190, and may not in contact with the first source electrode 210, the first drain electrode 230, the second drain electrode 235, and the second source electrode 215. In addition, the second high-k insulation structure 185 may include the second high-k insulation layer pattern 187 and the second insulation layer pattern 189. For example, the second high-k insulation layer pattern 187 may be located adjacent to the substrate 110, and the second insulation layer pattern 189 may be disposed to overlap the second gate electrode pattern 182 on the second high-k insulation layer pattern 187. The second high-k insulation layer pattern 187 may include metal oxide having a high dielectric constant, and the second insulation layer pattern 189 may include silicon compound, metal oxide, etc. In exemplary embodiments, the first high-k insulation structure 190 and the second high-k insulation structure 185 may be simultaneously formed using the same materials. In some exemplary embodiments, when the second insulation layer pattern 189 and the second high-k insulation layer pattern 187 have the same materials, the second high-k insulation structure 185 may be formed as a single layer.

The second gate electrode 180 may be disposed on the first high-k insulation structure 190. In exemplary embodiments, the second gate electrode 180 may be located to overlap the first gate electrode 170 and the first high-k insulation structure 190. In addition, a width of the second gate electrode 180 may be equal to or greater than a width of the first gate electrode 170. Further, the first gate electrode 170 and the second gate electrode 180 may serve as a storage capacitor (e.g., the first capacitor) of the OLED device 100. For example, the first gate electrode 170 may serve as a gate electrode of the first semiconductor element 250 or may serve as a lower electrode of the storage capacitor by controlling a signal provided in the first gate electrode 170 by the OLED device 100. Thus, the second gate electrode 180 together with the first gate electrode 170 may serve as a storage capacitor of the OLED device 100. Since the first gate electrode 170 and the second gate electrode 180 serve as the storage capacitor, the storage capacitor using the first high-k insulation structure 190 as a dielectric layer may secure a relatively large capacitance. The second gate electrode 180 may include a metal, an alloy of a metal, metal nitride, conductive metal oxide, transparent conductive materials, etc. These may be used alone or in a suitable combination thereof. Alternatively, the second gate electrode 180 may have a multi-layered structure. Accordingly, the first capacitor including the first gate electrode 170 and the second gate electrode 180 may be constituted.

The second gate electrode pattern 182 may be disposed in the third region 30 on the second high-k insulation structure 185, and may be spaced apart from the first gate electrode pattern 172. The second gate electrode pattern 182 may serve as a wiring. For example, the second gate electrode pattern 182 may include a data signal wiring providing a data signal, a gate signal wiring providing a gate signal, an initialization signal wiring providing an initialization signal, an emission signal wiring providing an emission signal, a power supply voltage wiring providing a power supply voltage, etc. The second gate electrode pattern 182 may include a metal, a metal alloy, metal nitride, conductive metal oxide, transparent conductive materials, etc. These may be used alone or in a suitable combination thereof. Alternatively, the second gate electrode pattern 182 may have a multi-layered structure. In exemplary embodiments, the second gate electrode 180 and the second gate electrode pattern 182 may be located at the same layer, and may be simultaneously formed using the same materials.

The first insulating interlayer 195 may be disposed on the gate insulation layer 150, the second gate electrode 180, the third gate electrode 175, the second gate electrode pattern 182, and the first gate electrode pattern 172. The first insulating interlayer 195 may cover the second gate electrode 180, the third gate electrode 175, the second gate electrode pattern 182, and the first gate electrode pattern 172 on the gate insulation layer 150, and may on the entire gate insulation layer 150. For example, the first insulating interlayer 195 may cover the second gate electrode 180, the third gate electrode 175, the second gate electrode pattern 182, and the first gate electrode pattern 172 on the gate insulation layer 150, and may be disposed as a substantially uniform thickness along a profile of the second gate electrode 180, the third gate electrode 175, the second gate electrode pattern 182, and the first gate electrode pattern 172. Alternatively, the first insulating interlayer 195 may sufficiently cover the second gate electrode 180, the third gate electrode 175, the second gate electrode pattern 182, and the first gate electrode pattern 172 on the gate insulation layer 150, and may have a substantially flat upper surface without a step around the second gate electrode 180, the third gate electrode 175, the second gate electrode pattern 182, and the first gate electrode pattern 172. The first insulating interlayer 195 may include silicon compound, metal oxide, etc.

The first electrode pattern 232 may be disposed in the third region 30 on the first insulating interlayer 195. The first electrode pattern 232 may correspond to a lower electrode of the second capacitor 280. The first electrode pattern 232 may include a metal, an alloy of a metal, metal nitride, conductive metal oxide, transparent conductive oxide, etc. These may be used alone or in a suitable combination thereof. Alternatively, the first electrode pattern 232 may have multi-layered structure.

The second insulating interlayer 205 may be disposed on the first insulating interlayer 195 and the first electrode pattern 232. The second insulating interlayer 205 may cover the first electrode pattern 232 on the first insulating interlayer 195, and may be disposed on the entire first insulating interlayer 195. For example, the second insulating interlayer 205 may cover the first electrode pattern 232 on the first insulating interlayer 195, and may be disposed as a substantially uniform thickness along a profile of the first electrode pattern 232. Alternatively, the second insulating interlayer 205 may sufficiently cover the first electrode pattern 232 on the first insulating interlayer 195, and may have a substantially flat upper surface without a step around the first electrode pattern 232. The second insulating interlayer 205 may include silicon compound, metal oxide, etc.

The first source electrode 210 and the first drain electrode 230 may be disposed in the first region 10 on the second insulating interlayer 205. The first source electrode 210 may be in direct contact with a source region of the first active layer 130 via a first contact hole 208 formed by removing a first portion of the second insulating interlayer 205, the first insulating interlayer 195, and the gate insulation layer 150. The first drain electrode 230 may be in direct contact with a drain region of the first active layer 130 via a second contact hole 209 formed by removing a second portion of the second insulating interlayer 205, the first insulating interlayer 195, and the gate insulation layer 150. Each of the first source electrode 210 and the first drain electrode 230 may include a metal, an alloy, metal nitride, conductive metal oxide, transparent conductive materials, etc. These may be used alone or in a suitable combination thereof. In some exemplary embodiments, each of the first source and first drain electrodes 210 and 230 may have a multi-layered structure. Accordingly, the first semiconductor element 250 including the first active layer 130, the first gate electrode

170, the first source electrode 210, and the first drain electrode 230 may be constituted.

The second source electrode 215 and the second drain electrode 235 may be disposed in the second region 20 on the second insulating interlayer 205. The second source electrode 215 may be in direct contact with a source region of the second active layer 135 via a third contact hole 206 formed by removing a third portion of the second insulating interlayer 205, the first insulating interlayer 195, and the gate insulation layer 150. The second drain electrode 235 may be in direct contact with a drain region of the second active layer 135 via a fourth contact hole 207 formed by removing a fourth portion of the second insulating interlayer 205, the first insulating interlayer 195, and the gate insulation layer 150. Each of the second source electrode 215 and the second drain electrode 235 may include a metal, an alloy, metal nitride, conductive metal oxide, transparent conductive materials, etc. These may be used alone or in a suitable combination thereof. In some exemplary embodiments, each of the second source and second drain electrodes 215 and 235 may have a multi-layered structure. Accordingly, the second semiconductor element 255 including the second active layer 135, the third gate electrode 175, the second source electrode 215, and the second drain electrode 235 may be constituted.

In exemplary embodiments, the first semiconductor element 250 and the second semiconductor element 255 has a top gate structure, but not being limited thereto. For example, in some exemplary embodiments, the first semiconductor element 250 and the second semiconductor element 255 may have a bottom gate structure or a double gate structure.

In exemplary embodiments, in a process for forming the first contact hole 208, the second contact hole 209, the third contact hole 206, and the fourth contact hole 207, since the first high-k insulation structure 190 and the second high-k insulation structure 185 are not removed (e.g., only the second insulating interlayer 205, the first insulating interlayer 195, and the gate insulation layer 150 are removed), the first, second, third, and fourth contact holes 208, 209, 206, and 207 may be readily formed.

The second electrode pattern 234 may be disposed in the third region 30 on the second insulating interlayer 205. The second electrode pattern 234 may be disposed on a portion of the second insulating interlayer 205 under which the first electrode pattern 232 is located. In other words, the second electrode pattern 234 may be disposed on the second insulating interlayer 205 to overlap the first electrode pattern 232, and may correspond to an upper electrode of the second capacitor 280. That is, the second electrode pattern 234 together with the first electrode pattern 232 may be defined as the second capacitor 280. The second electrode pattern 234 may include a metal, a metal alloy, metal nitride, conductive metal oxide, transparent conductive materials, etc. These may be used alone or in a suitable combination thereof. Alternatively, the second electrode pattern 234 may have a multi-layered structure. In exemplary embodiments, the first source electrode 210, the first drain electrode 230, the second source electrode 215, the second drain electrode 235, and the second electrode pattern 234 may be located at the same layer, and may be simultaneously formed using the same materials.

The planarization layer 270 may be disposed on the second insulating interlayer 205, the first source electrode 210, the first drain electrode 230, the second source electrode 215, the second drain electrode 235, and the second electrode pattern 234. The planarization layer 270 may cover the first source electrode 210, the first drain electrode 230, the second source electrode 215, the second drain electrode 235, and the second electrode pattern 234 on the second insulating interlayer 205, and may be disposed on the entire second insulating interlayer 205. For example, the planarization layer 270 may be disposed as a high thickness to sufficiently cover the first source electrode 210, the first drain electrode 230, the second source electrode 215, the second drain electrode 235, and the second electrode pattern 234 on the second insulating interlayer 205. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. In exemplary embodiments, the planarization layer 270 may include organic materials such as an epoxy-based resin, an acryl-based resin, photoresist, a polyacryl-based resin, a polyimide-based resin, a polyamide-based resin, a siloxane-based resin, etc.

The lower electrode 290 may be disposed on the planarization layer 270. The lower electrode 290 may be disposed on a portion of the planarization layer 270 under which the first semiconductor element 250 is located, and may be in contact with the first drain electrode 230 via contact hole formed by removing a portion of the planarization layer 270. In addition, the lower electrode 290 may be electrically connected to the first semiconductor element 250. The lower electrode 290 may include a metal, a metal alloy, metal nitride, conductive metal oxide, transparent conductive materials, etc. These may be used alone or in a suitable combination thereof. In some exemplary embodiments, the lower electrode 290 may have a multi-layered structure.

The pixel defining layer 310 may be disposed on a portion of the lower electrode 290 and the planarization layer 270. The pixel defining layer 310 may cover both lateral portion of the lower electrode 290 and expose a portion of the lower electrode 290. The pixel defining layer 310 may include organic materials or inorganic materials. In exemplary embodiments, the pixel defining layer 310 may include organic materials.

The light emitting layer 330 may be disposed on the lower electrode 290 exposed by the pixel defining layer 310. The light emitting layer 330 may be formed using at least one of light emitting materials capable of generating different colors of light (e.g., a red color of light, a blue color of light, and a green color of light, etc.) according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be disposed on the light emitting layer 330 (e.g., to overlap the light emitting layer 330 on a lower surface of an encapsulation substrate). The color filter may include at least one selected from a red color filter, a green color filter, and a blue color filter. Alternatively, the color filter may include a yellow color filter, a cyan color filter, and a magenta color filter. The color filter may include a photosensitive resin, etc.

The upper electrode 340 may be disposed on the pixel defining layer 310 and the light emitting layer 330. The upper electrode 340 may cover the light emitting layer 330 and the pixel defining layer 310, may be disposed on the entire light emitting layer 330 and the entire pixel defining layer 310. The upper electrode 340 may include a metal, a metal alloy, metal nitride, conductive metal oxide, transparent conductive materials, etc. These may be used alone or in a suitable combination thereof. Alternatively, the upper electrode 340 may have a multi-layered structure. Accordingly, the light emitting structure 200 including the lower electrode 290, the light emitting layer 330, and the upper electrode 340 may be disposed.

An encapsulation substrate (not shown) may be disposed on the upper electrode 340. The encapsulation substrate and the substrate 110 may include substantially the same materials. For example, the encapsulation substrate may include a quartz substrate, a synthetic quartz substrate, a calcium fluoride substrate, a fluoride-doped quartz substrate, a sodalime glass substrate, a non-alkali glass substrate, etc. In some exemplary embodiments, the encapsulation substrate may include a transparent inorganic material or flexible plastic. For example, the encapsulation substrate may include a flexible transparent resin substrate. In this case, to increase flexibility of the OLED device 100, the encapsulation substrate may include a stacked structure where at least one inorganic layer and at least one organic layer are alternately stacked.

When an OLED device 100 in accordance with exemplary embodiments includes the first high-k insulation structure 190 interposed only between the first gate electrode 170 and the second gate electrode 180 (e.g., the first high-k insulation structure 190 is not in direct contact with the first source electrode 210 and the first drain electrode 230), the first, second, third, and fourth contact holes 208, 209, 206, and 207 may be readily formed because the first high-k insulation structure 190 is not removed in a process for forming the first contact hole 208, the second contact hole 209, the third contact hole 206, and the fourth contact hole 207.

In addition, when the first high-k insulation structure 190 completely covers the first gate electrode 170, the OLED device 100 may protect the first gate electrode 170 in a process for etching the second gate electrode 180.

Further, when an OLED device 100 includes the first high-k insulation structure 190, the OLED device 100 may include the first capacitor (e.g., the first gate electrode 170 and the second gate electrode 180) having a high dielectric constant. Accordingly, the OLED device 100 may serve as an OLED device including the first capacitor capable of securing a relatively large capacitance.

Figure 3:
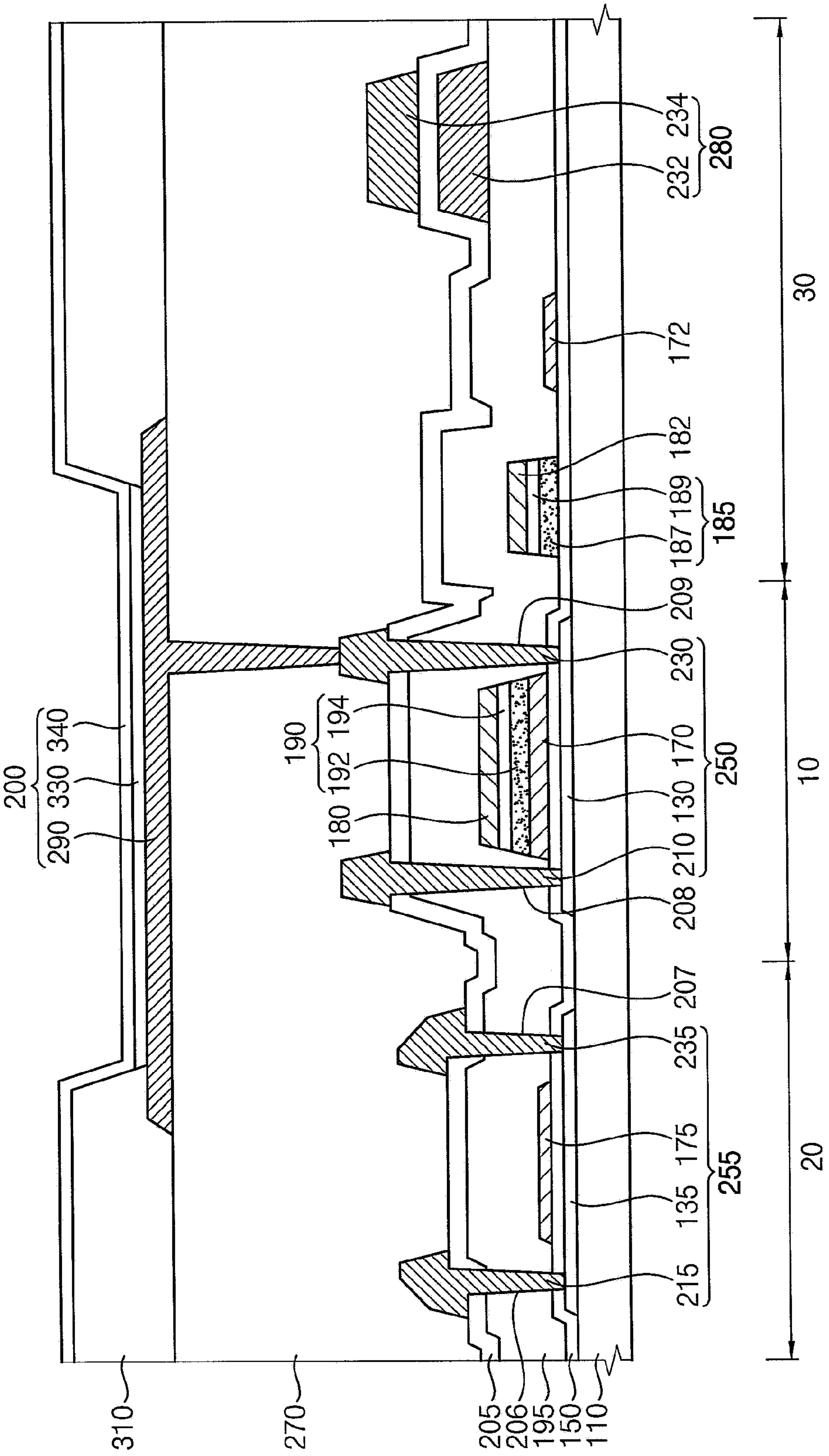
FIG. 3 is a cross-sectional view illustrating an example of the OLED device of FIG. 1.

FIG. 3 is a cross-sectional view illustrating an example of the OLED device of FIG. 1. An OLED device illustrated in FIG. 3 may have a configuration substantially the same as or similar to that of an OLED device 100 described with reference to FIGS. 1 and 2 except for a shape of a first high-k insulation structure 190. In FIG. 3, detailed descriptions for elements that are substantially the same as or similar to elements described with reference to FIGS. 1 and 2 may not be repeated.

Referring to FIG. 3, the first high-k insulation structure 190 may be disposed in the first region 10 on the first gate electrode 170. In exemplary embodiments, the first high-k insulation structure 190 may be disposed only in an upper surface of the first gate electrode 170. For example, when the first high-k insulation structure 190 is disposed only in the upper surface of the first gate electrode 170, a distance where the first high-k insulation structure 190 is spaced apart from the first source and first drain electrodes 210 and 230 may be increased. In this case, since a process margin is secured in a process for forming the first contact hole 208 and the second contact hole 209, the first and second contact holes 208 and 209 may be relatively readily formed.

The first high-k insulation structure 190 may be spaced apart from the first source and first drain electrodes 210 and 230. In other words, the first high-k insulation structure 190 may not be in direct contact with the first source and first drain electrodes 210 and 230.

In exemplary embodiments, the first high-k insulation structure 190 may include the first high-k insulation layer pattern 192 and the first insulation layer pattern 194 disposed on the first high-k insulation layer pattern 192. Here, the first high-k insulation layer pattern 192 may be in direct contact with an upper surface of the first gate electrode 170, and the first insulation layer pattern 194 may be simultaneously in contact with a lower surface of the second gate electrode 180 and an upper surface of the first high-k insulation layer pattern 192. In addition, a thickness of the first high-k insulation layer pattern 192 may be greater than a thickness of the first insulation layer pattern 194. The first high-k insulation layer pattern 192 may include metal oxide having a high dielectric constant, and the first insulation layer pattern 194 may include silicon compound, metal oxide, etc. Accordingly, the first high-k insulation structure 190 including the first high-k insulation layer pattern 192 and the first insulation layer pattern 194 may be constituted.

The second gate electrode 180 may be disposed on the first high-k insulation structure 190. In exemplary embodiments, the second gate electrode 180 may be located to overlap the first gate electrode 170 and the first high-k insulation structure 190. In addition, a width of the second gate electrode 180 may be less than a width of the first gate electrode 170. The second gate electrode 180 may include a metal, an alloy of a metal, metal nitride, conductive metal oxide, transparent conductive materials, etc. These may be used alone or in a suitable combination thereof. Alternatively, the second gate electrode 180 may have a multi-layered structure.

Figure 4A:
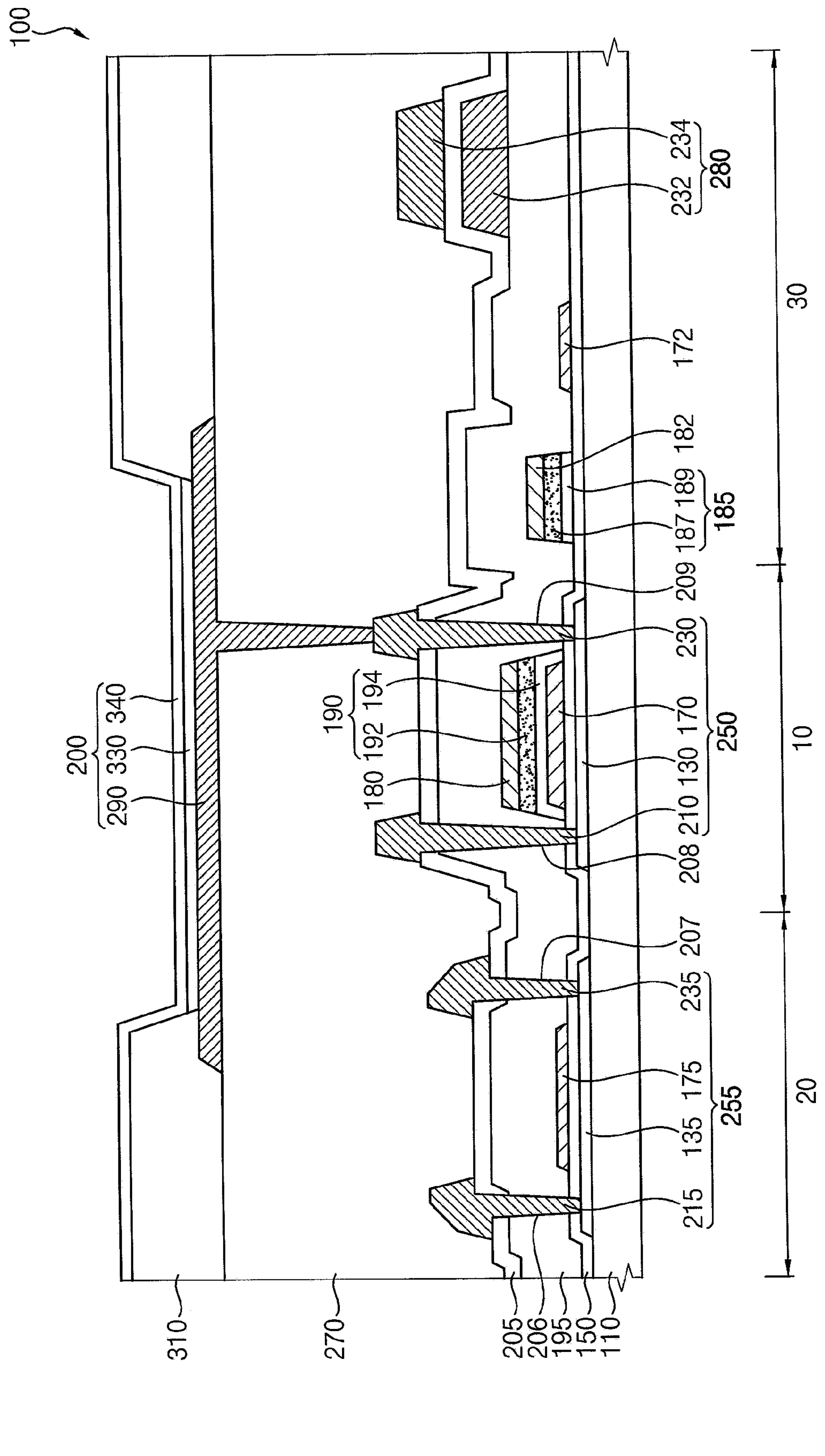
FIG. 4A is a cross-sectional view illustrating another example of the OLED device of FIG. 1.
Figure 4B:
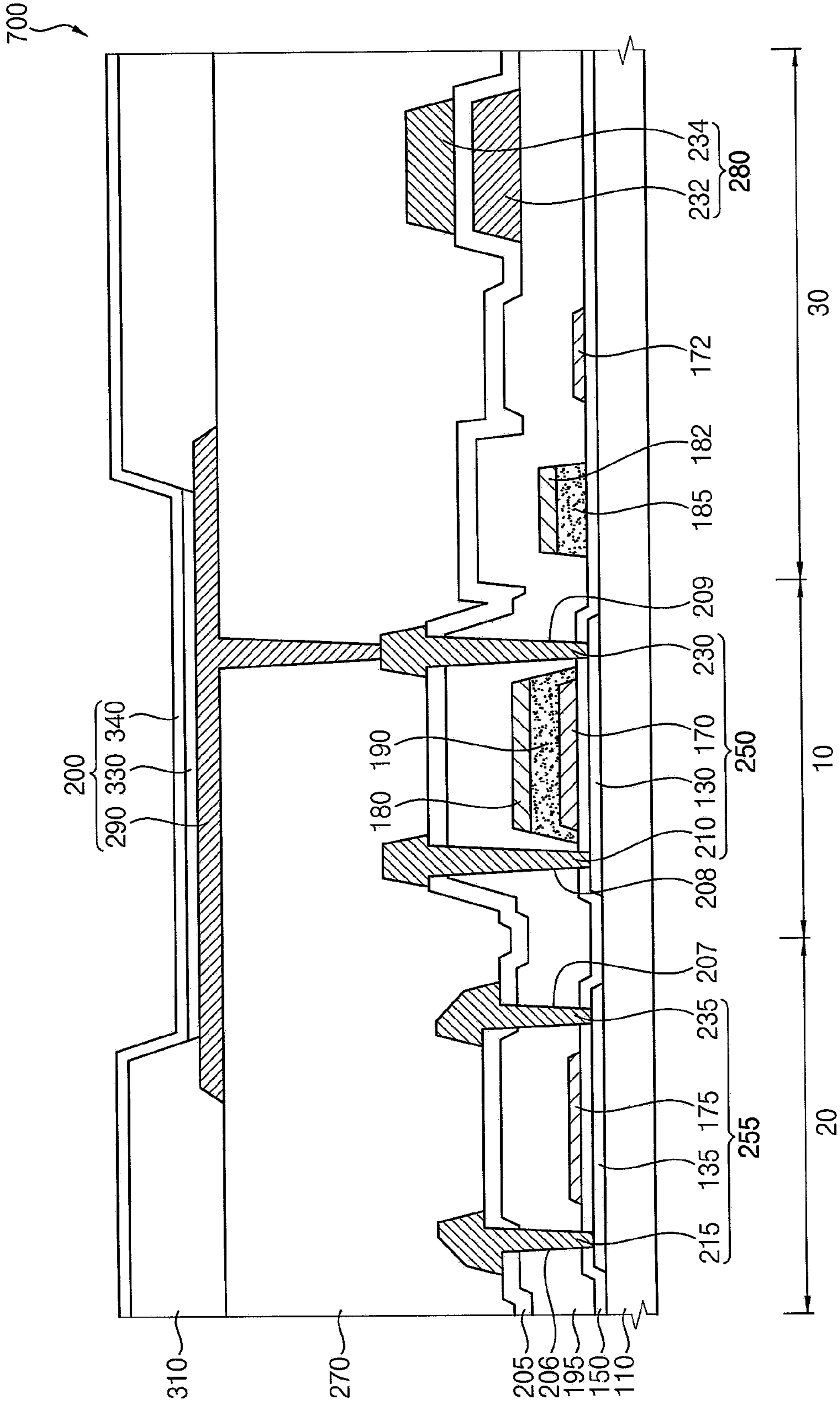
FIG. 4B is a cross-sectional view illustrating an example of a first high-k insulation structure included in the OLED device of FIG. 4A.

FIG. 4A is a cross-sectional view illustrating another example of the OLED device of FIG. 1, and FIG. 4B is a cross-sectional view illustrating an example of a first high-k insulation structure included in the OLED device of FIG. 4A. An OLED device illustrated in FIG. 4A may have a configuration substantially the same as or similar to that of an OLED device 100 described with reference to FIGS. 1 and 2 except for a shape of a first high-k insulation structure 190. In FIG. 4A, detailed descriptions for elements that are substantially the same as or similar to elements described with reference to FIGS. 1 and 2 may not be repeated.

Referring to FIG. 4A, the first high-k insulation structure 190 may be disposed in the first region 10 on the first gate electrode 170. In exemplary embodiments, the first high-k insulation structure 190 may completely cover the first gate electrode 170, and may protect the first gate electrode 170. In addition, the first high-k insulation structure 190 may be spaced apart from the first source and first drain electrodes 210 and 230. In other words, the first high-k insulation structure 190 may not be in direct contact with the first source and first drain electrodes 210 and 230.

In exemplary embodiments, the first high-k insulation structure 190 may include the first insulation layer pattern 194 covering the first gate electrode 170 and the first high-k insulation layer pattern 192 disposed on the first insulation layer pattern 194. Here, the first insulation layer pattern 194 may be in direct contact with an upper surface of the first gate electrode 170, and the first high-k insulation layer pattern 192 may be simultaneously in contact with a lower surface of the second gate electrode 180 and an upper surface of the first insulation layer pattern 194. In addition, the first insulation layer pattern 194 may have a relatively low dielectric constant less than the first high-k insulation layer pattern 192. In exemplary embodiments, a thickness of the first high-k insulation layer pattern 192 may be greater than a thickness of the first insulation layer pattern 194. The first high-k insulation layer pattern 192 may include metal oxide having a high dielectric constant. In addition, the first insulation layer pattern 194 may include silicon compound, metal oxide, etc. Accordingly, the first high-k insulation structure 190 including the first high-k insulation layer pattern 192 and the first insulation layer pattern 194 may be constituted.

In some exemplary embodiments, when the first insulation layer pattern 194 and the first high-k insulation layer pattern 192 is formed using the same materials, the first high-k insulation structure 190 may be formed as a single layer, as illustrated FIG. 4B. In this case, the first capacitor may serve as a capacitor having a relatively high dielectric constant. In addition, when the second insulation layer pattern 189 and the second high-k insulation layer pattern 187 have the same materials, the second high-k insulation structure 185 may be formed as a single layer.

Figure 5A:
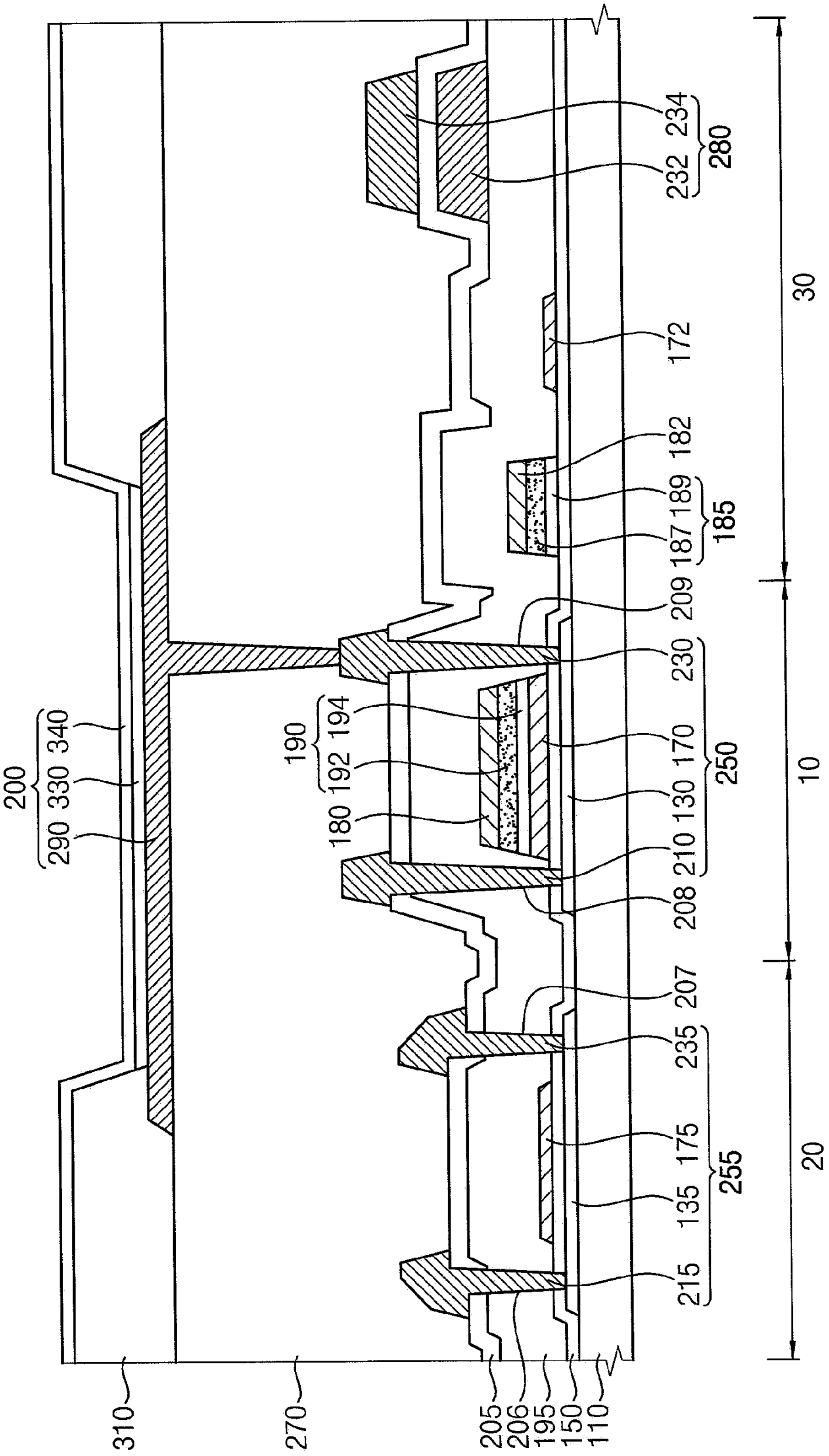
FIG. 5A is a cross-sectional view illustrating still another example of the OLED device of FIG. 1.
Figure 5B:
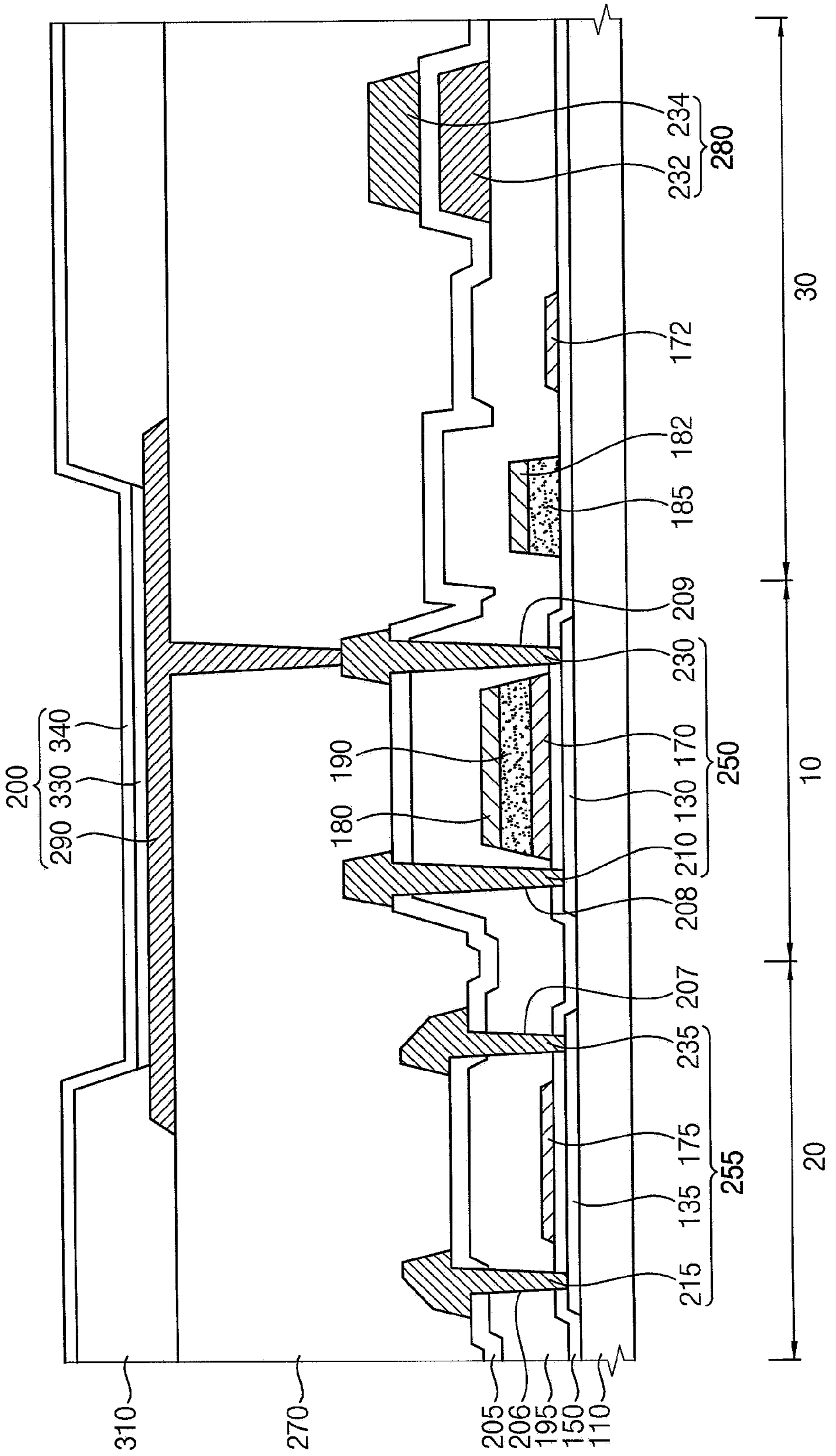
FIG. 5B is a cross-sectional view illustrating an example of a first high-k insulation structure included in the OLED device of FIG. 5A.

FIG. 5A is a cross-sectional view illustrating still another example of the OLED device of FIG. 1, and FIG. 5B is a cross-sectional view illustrating an example of a first high-k insulation structure included in the OLED device of FIG. 5A. An OLED device illustrated in FIG. 5A may have a configuration substantially the same as or similar to that of an OLED device described with reference to FIG. 3 except for a shape of a first high-k insulation structure 190. In FIG. 5A, detailed descriptions for elements that are substantially the same as or similar to elements described with reference to FIG. 3 may not be repeated.

Referring to FIG. 5A, the first high-k insulation structure 190 may be disposed in the first region 10 on the first gate electrode 170. In exemplary embodiments, the first high-k insulation structure 190 may be disposed only in an upper surface of the first gate electrode 170.

In exemplary embodiments, the first high-k insulation structure 190 may include the first insulation layer pattern 194 and the first high-k insulation layer pattern 192 disposed on the first insulation layer pattern 194. Here, the first insulation layer pattern 194 may be in direct contact with an upper surface of the first gate electrode 170, and the first high-k insulation layer pattern 192 may be simultaneously in contact with a lower surface of the second gate electrode 180 and an upper surface of the first high-k insulation layer pattern 192. In addition, a thickness of the first high-k insulation layer pattern 192 may be greater than a thickness of the first insulation layer pattern 194. The first high-k insulation layer pattern 192 may include metal oxide having a high dielectric constant, and the first insulation layer pattern 194 may include silicon compound, metal oxide, etc. Accordingly, the first high-k insulation structure 190 including the first high-k insulation layer pattern 192 and the first insulation layer pattern 194 may be constituted.

The second gate electrode 180 may be disposed on the first high-k insulation structure 190. In exemplary embodiments, the second gate electrode 180 may be located to overlap the first gate electrode 170 and the first high-k insulation structure 190. In addition, a width of the second gate electrode 180 may be less than a width of the first gate electrode 170. The second gate electrode 180 may include a metal, an alloy of a metal, metal nitride, conductive metal oxide, transparent conductive materials, etc. These may be used alone or in a suitable combination thereof. Alternatively, the second gate electrode 180 may have a multi-layered structure.

In some exemplary embodiments, when the first insulation layer pattern 194 and the first high-k insulation layer pattern 192 is formed using the same materials, the first high-k insulation structure 190 may be formed as a single layer, as illustrated FIG. 5B. In this case, the first capacitor may serve as a capacitor having a relatively high dielectric constant. In addition, when the second insulation layer pattern 189 and the second high-k insulation layer pattern 187 have the same materials, the second high-k insulation structure 185 may be formed as a single layer.

Figure 6:
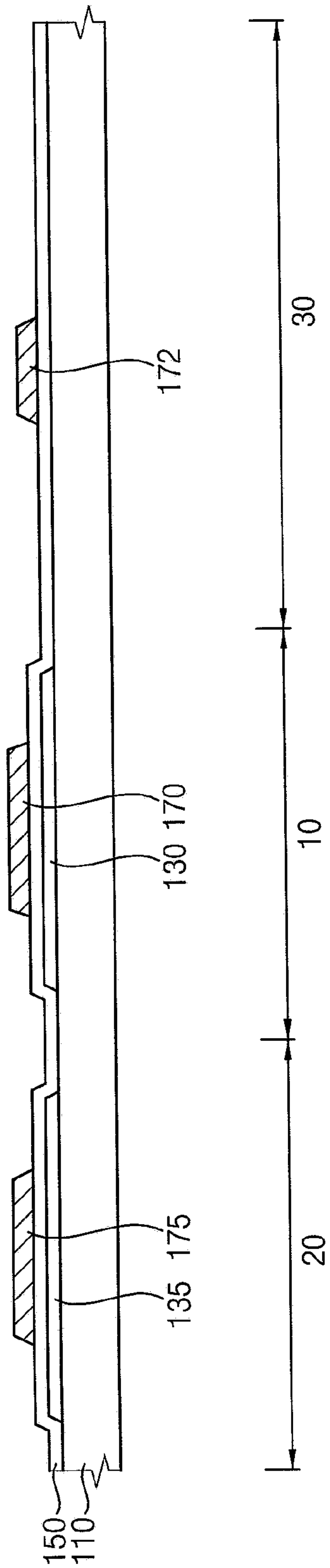
FIG. 6, FIG. 7, FIG. 8, FIG. 9, FIG. 10, FIG. 11, FIG. 12, FIG. 13, FIG. 14, FIG. 15, and FIG. 16 are cross-sectional views illustrating a method of manufacturing an OLED device in accordance with exemplary embodiments.
Figure 7:
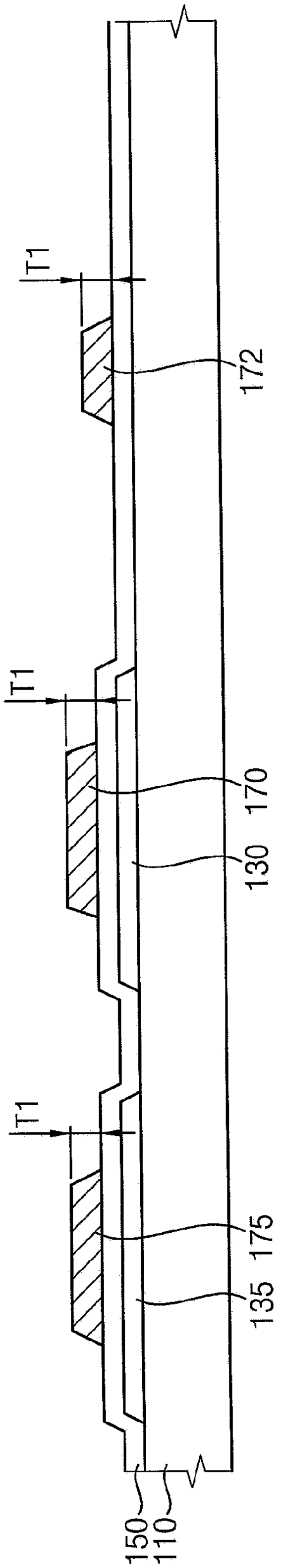
Figure 10:
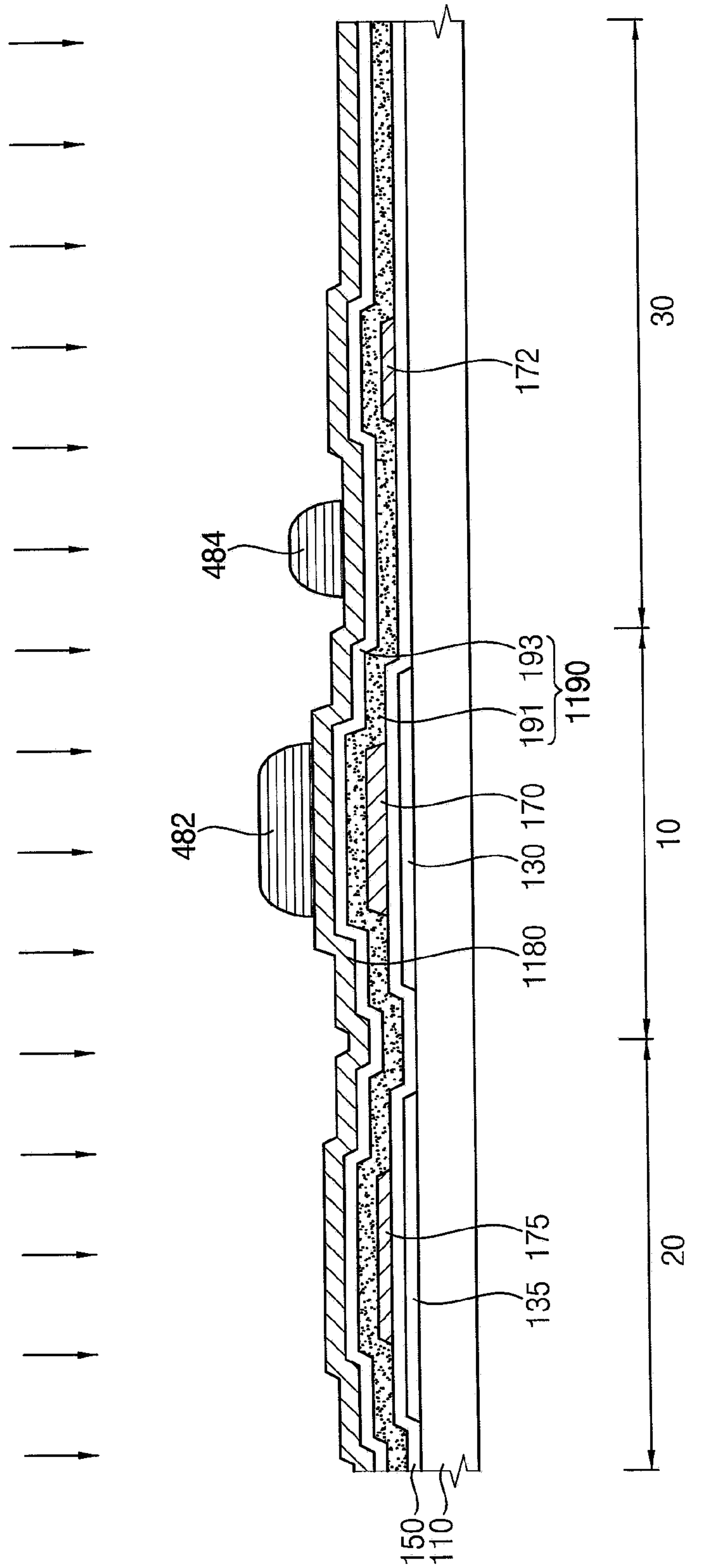
Figure 11:
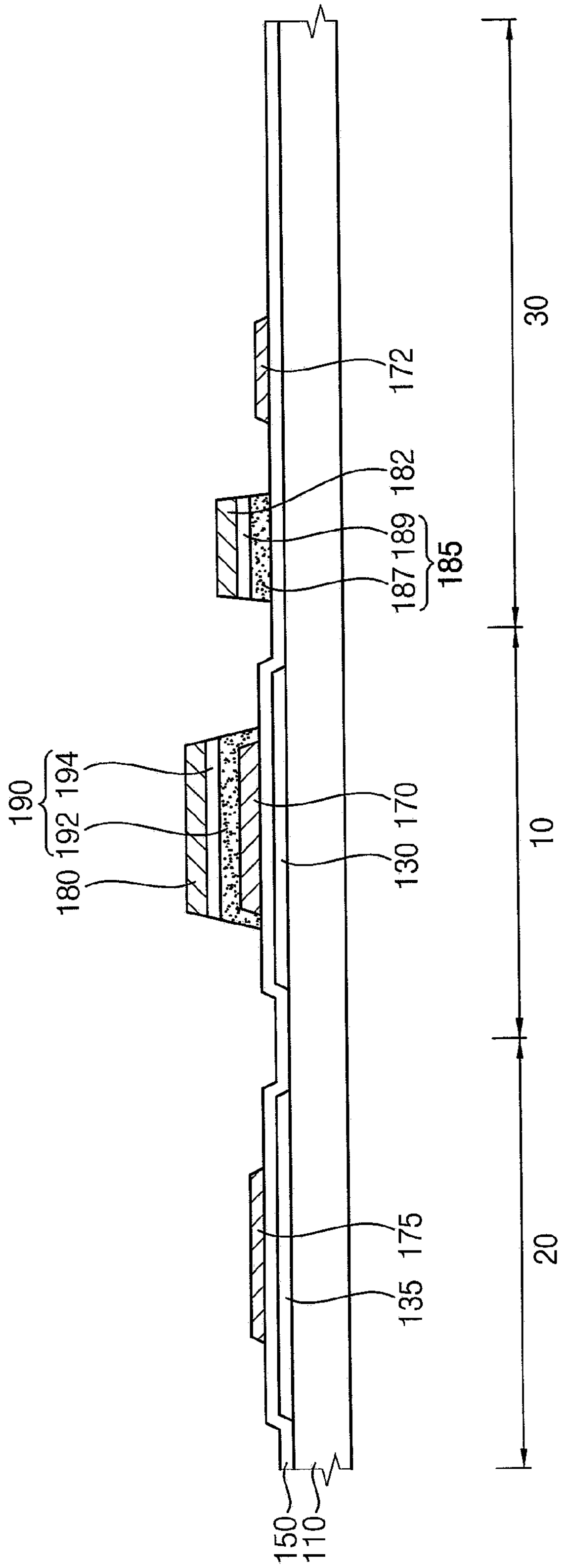
Figure 12:
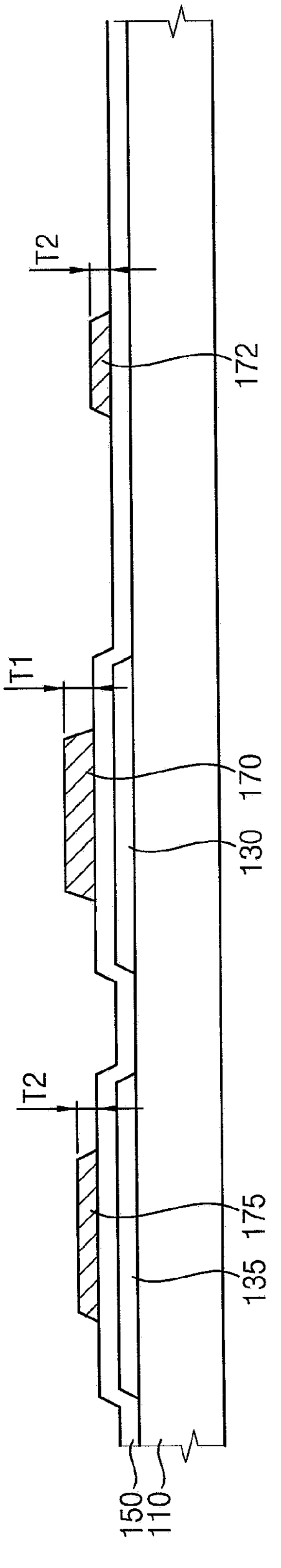

FIG. 6, FIG. 7, FIG. 8, FIG. 9, FIG. 10, FIG. 11, FIG. 12, FIG. 13, FIG. 14, FIGS. 15, and 16 are cross-sectional views illustrating a method of manufacturing an OLED device in accordance with exemplary embodiments. For example, FIG. 7 is a cross-sectional view for describing a thickness of each of a first gate electrode, a third gate electrode, and a first gate electrode pattern of FIG. 6, and FIG. 12 is a cross-sectional view for comparing a thickness of a first gate electrode and thicknesses of a third gate electrode and a first gate electrode pattern of FIG. 11.

Referring to FIG. 6, a substrate 110 may be provided. The substrate 110 may include transparent or opaque materials. For example, the substrate 110 may be formed using a quartz substrate, a synthetic quartz substrate, a calcium fluoride substrate, a fluoride-doped quartz substrate, a sodalime glass substrate, a non-alkali glass substrate etc. The substrate 110 may have a first region 10, a second region 20, and a third region 30. For example, the second region 20 may be located between the first region 10 and the third region 30, and the first region 10 may be spaced apart from the third region 30.

A buffer layer (not shown) may be formed on the substrate 110. The buffer layer may be formed on the entire substrate 110. The buffer layer may prevent the diffusion of metal atoms and/or impurities from the substrate 110 into semiconductor elements, capacitors, and a light emitting structure. In addition, the buffer layer may control a rate of a heat transfer in a crystallization process for forming an active layer, thereby obtaining substantially uniform active layer. Further, the buffer layer may improve a surface flatness of the substrate 110 when a surface of the substrate 110 is relatively irregular. In some exemplary embodiments, according to a type of the substrate 110, at least two buffer layers may be provided on the substrate 110, or the buffer layer may not be formed. For example, the buffer layer may be formed using organic materials or inorganic materials.

A first active layer 130 may be formed in the first region 10 on the substrate 110. For example, the first active layer 130 may be formed using an oxide semiconductor, an inorganic semiconductor, an organic semiconductor, etc.

A second active layer 135 may be formed in the second region 20 on the substrate 110. The second active layer 135 may be formed using an oxide semiconductor, an inorganic semiconductor, an organic semiconductor, etc. In exemplary embodiments, the first active layer 130 and the second active layer 135 may be located at the same layer, and may be simultaneously formed using the same materials. For example, after a preliminary active layer is formed on the entire substrate 110, the first active layer 130 and the second active layer 135 may be formed by selectively etching the preliminary active layer.

A gate insulation layer 150 may be formed on the first active layer 130, the second active layer 135, and the substrate 110. The gate insulation layer 150 may cover the first active layer 130 and the second active layer 135 on the substrate 110, and may be formed on the entire substrate 110. For example, the gate insulation layer 150 may cover the first and second active layers 130 and 135 on the substrate 110, and may be formed as a substantially uniform thickness along a profile of the first and second active layers 130 and 135. Alternatively, the gate insulation layer 150 may sufficiently cover the first and second active layers 130 and 135 on the substrate 110, and may have a substantially flat upper surface without a step around the first and second active layers 130 and 135. The gate insulation layer 150 may be formed using silicon compound, metal oxide, etc.

A first gate electrode 170 may be formed in the first region 10 on the gate insulation layer 150. The first gate electrode 170 may be formed on a portion of the gate insulation layer 150 under which the first active layer 130 is located. The first gate electrode 170 may be formed using a metal, a metal alloy, metal nitride, conductive metal oxide, transparent conductive materials, etc. For example, the first gate electrode 170 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. Alternatively, the first gate electrode 170 may have a multi-layered structure.

A third gate electrode 175 may be formed in the second region 20 on the gate insulation layer 150. The third gate electrode 175 may be disposed on a portion of the gate insulation layer 150 under which the second active layer 135 is located. The third gate electrode 175 may be formed using a metal, a metal alloy, metal nitride, conductive metal oxide, transparent conductive materials, etc. These may be used alone or in a suitable combination thereof. Alternatively, the third gate electrode 175 may have a multi-layered structure.

A first gate electrode pattern 172 may be formed in the third region 30 on the gate insulation layer 150. The first gate electrode pattern 172 may serve as a wiring. For example, the first gate electrode pattern 172 may include a data signal wiring providing a data signal, a gate signal wiring providing a gate signal, an initialization signal wiring providing an initialization signal, an emission signal wiring providing an emission signal, a power supply voltage wiring providing a power supply voltage, etc. The first gate electrode pattern 172 may be formed using a metal, a metal alloy, metal nitride, conductive metal oxide, transparent conductive materials, etc. These may be used alone or in a suitable combination thereof. Alternatively, the first gate electrode pattern 172 may have a multi-layered structure.

In exemplary embodiments, the first gate electrode 170, the third gate electrode 175, and the first gate electrode pattern 172 may be located at the same layer, and may be simultaneously formed using the same materials. For example, after a preliminary gate electrode layer is formed on the entire gate insulation layer 150 as a first thickness T1, the first gate electrode 170, the third gate electrode 175, and the first gate electrode pattern 172 may be formed by selectively etching the preliminary gate electrode layer. As illustrated in FIG. 7, each of the first gate electrode 170, the third gate electrode 175, and the first gate electrode pattern 172 may have the first thickness T1.

Figure 8:
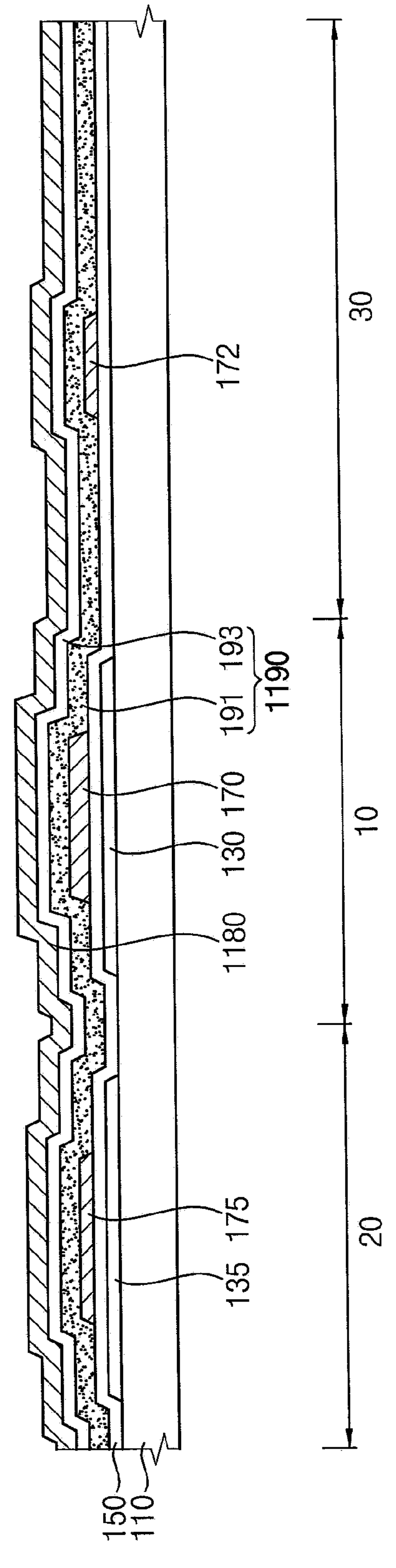

Referring to FIG. 8, a preliminary high-k insulation structure 1190 may be formed on the entire gate insulation layer 150. In exemplary embodiments, the preliminary high-k insulation structure 1190 may include a preliminary first high-k insulation layer 191 and a preliminary insulation layer 193 formed on the preliminary first high-k insulation layer 191.

The preliminary first high-k insulation layer 191 may cover the first gate electrode 170, the third gate electrode 175, and the first gate electrode pattern 172 on the gate insulation layer 150, and may be formed on the entire gate insulation layer 150. For example, the preliminary first high-k insulation layer 191 may cover the first gate electrode 170, the third gate electrode 175, and the first gate electrode pattern 172 on the gate insulation layer 150, and may be formed as a substantially uniform thickness along a profile of the first gate electrode 170, the third gate electrode 175, and the first gate electrode pattern 172. Alternatively, the preliminary first high-k insulation layer 191 may sufficiently cover the first gate electrode 170, the third gate electrode 175, and the first gate electrode pattern 172 on the gate insulation layer 150, and may have a substantially flat upper surface without a step around the first gate electrode 170, the third gate electrode 175, and the first gate electrode pattern 172 on the gate insulation layer 150. The first high-k insulation structure 190 may include metal oxide having a high dielectric constant. For example, the preliminary first high-k insulation layer 191 may be formed using AlxOy, ZrOx, HfOx, TiOx, etc.

The preliminary insulation layer 193 may be formed on the entire preliminary first high-k insulation layer 191. For example, the preliminary insulation layer 193 may be formed as a substantially uniform thickness along a profile of the preliminary first high-k insulation layer 191 on the preliminary first high-k insulation layer 191. Alternatively, the preliminary insulation layer 193 may have a substantially flat upper surface without a step on the preliminary first high-k insulation layer 191. The preliminary insulation layer 193 may be formed using silicon compound, metal oxide, etc. For example, the preliminary insulation layer 193 may include SiOx, SiNx, SiOxNy, SiOxCy, SiCxNy, AlOx, AlNx, TaOx, HfOx, ZrOx, TiOx, etc. Accordingly, the preliminary high-k insulation structure 1190 including the preliminary first high-k insulation layer 191 and the preliminary insulation layer 193 may be formed.

A preliminary second gate electrode layer 1180 may be formed on the preliminary high-k insulation structure 1190. For example, the preliminary second gate electrode layer 1180 may be formed as in a substantially uniform thickness along a profile of preliminary insulation layer 193 on the preliminary insulation layer 193. Alternatively, the preliminary second gate electrode layer 1180 may have a substantially uniform flat upper surface without a step on the preliminary insulation layer 193. The preliminary second gate electrode layer 1180 may be formed using a metal, an alloy of a metal, metal nitride, conductive metal oxide, transparent conductive materials, etc. These may be used alone or in a suitable combination thereof. In some exemplary embodiments, the preliminary second gate electrode 1180 may have a multi-layered structure.

Figure 9:
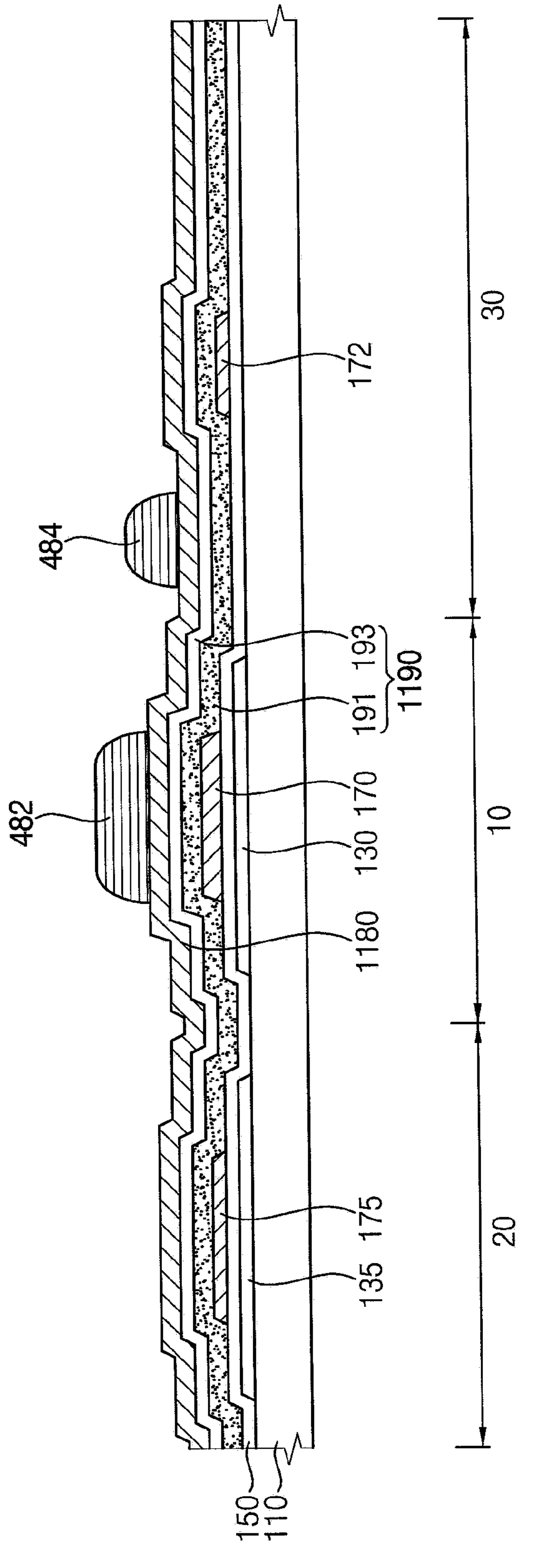

Referring to FIG. 9, a first photoresist 482 and a second photoresist 484 may be formed on the preliminary second gate electrode layer 1180. For example, the first photoresist 482 may be formed on the first gate electrode 170, and the second photoresist 484 may be formed in a portion of the third region 30 (e.g., between the first gate electrode 170 and the first gate electrode pattern 172).

Referring to FIG. 10, after the first photoresist 482 and the second photoresist 484 are formed, the preliminary second gate electrode layer 1180 and the preliminary high-k insulation structure 1190 may be partially removed using the first and second photoresists 482 and 484 as a mask. The etching process may be performed using $BCl_2$ gas or $Cl_2$ gas, and the preliminary second gate electrode layer 1180 may be relatively readily etched when the preliminary second gate electrode layer 1180 includes Ti or Al.

Referring to FIG. 11, after a selective etching process is performed in the preliminary second gate electrode layer 1180, a first high-k insulation structure 190 and a second gate electrode 180 may be formed on the first gate electrode 170, and a second high-k insulation structure 185 and a second gate electrode pattern 182 may be formed in the third region 30 of the gate insulation layer 150.

The first high-k insulation structure 190 may be formed in the first region 10 on the first gate electrode 170. In exemplary embodiments, the first high-k insulation structure 190 may completely cover the first gate electrode 170. For example, when the first high-k insulation structure 190 completely covers the first gate electrode 170, the first gate electrode 170 may be protected while the selective etching process is performed. In exemplary embodiments, the first high-k insulation structure 190 may include the a high-k insulation layer pattern 192 covering the first gate electrode 170 and a first insulation layer pattern 194 formed on the first high-k insulation layer pattern 192. In addition, the first insulation layer pattern 194 may have a relatively low dielectric constant less than the first high-k insulation layer pattern 192. Further, a thickness of the first high-k insulation layer pattern 192 may be greater than a thickness of the first insulation layer pattern 194.

The second high-k insulation structure 185 may be formed in the third region 30 on the gate insulation layer 150. In exemplary embodiments, the second high-k insulation structure 185 may be spaced apart from the first high-k insulation structure 190. In addition, the second high-k insulation structure 185 may include a second high-k insulation layer pattern 187 and a second insulation layer pattern 189. The first high-k insulation structure 190 and the second high-k insulation structure 185 may be simultaneously formed using the same materials.

A second gate electrode 180 may be formed on the first high-k insulation structure 190. In exemplary embodiments, the second gate electrode 180 may be located to overlap the first gate electrode 170 and the first high-k insulation structure 190. In addition, a width of the second gate electrode 180 may be equal to or greater than a width of the first gate electrode 170. Further, the first gate electrode 170 and the second gate electrode 180 may serve as a storage capacitor (e.g., a first capacitor) of an OLED device. Since the first gate electrode 170 and the second gate electrode 180 serve as the storage capacitor, the storage capacitor using the first high-k insulation structure 190 as a dielectric layer may secure a relatively large capacitance.

A second gate electrode pattern 182 may be formed in the third region 30 on the second high-k insulation structure 185, and may be spaced apart from the first gate electrode pattern 172. The second gate electrode pattern 182 may serve as a wiring. For example, the second gate electrode pattern 182 may include a data signal wiring providing a data signal, a gate signal wiring providing a gate signal, an initialization signal wiring providing an initialization signal, an emission signal wiring providing an emission signal, a power supply voltage wiring providing a power supply voltage, etc. In exemplary embodiments, the second gate electrode 180 and the second gate electrode pattern 182 may be located at the same layer, and may be simultaneously formed using the same materials.

During the selective etching process, as illustrated in FIG. 12, a size of each of the third gate electrode 175 and the first gate electrode pattern 172 may be reduced compared to the previous state (e.g., the state before the selective etching process), and a thickness of each of the third gate electrode 175 and the first gate electrode pattern 172 may be reduced to a second thickness T2 less than the first thickness T1. In other words, a thickness of the first gate electrode 170 may be greater than a thickness of each of the third gate electrode 175 and the first gate electrode pattern 172.

Figure 13:
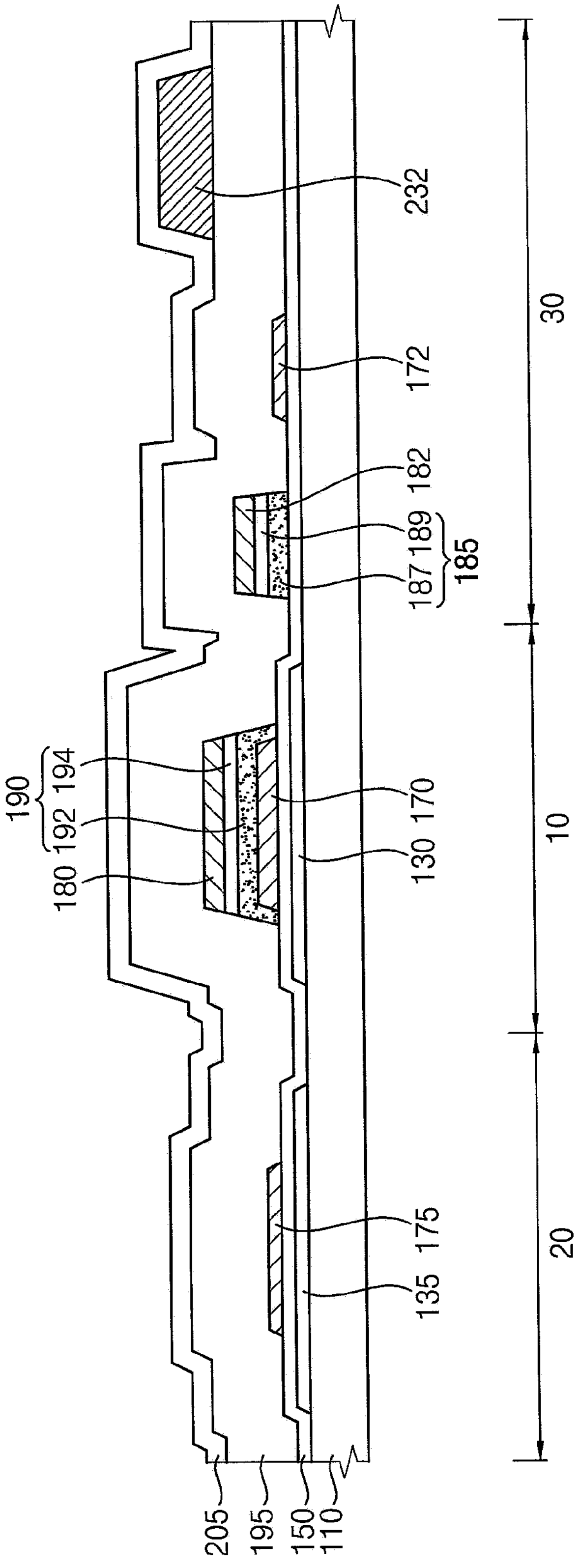

Referring to FIG. 13, a first insulating interlayer 195 may be formed on the gate insulation layer 150, the second gate electrode 180, the third gate electrode 175, the second gate electrode pattern 182, and the first gate electrode pattern 172. The first insulating interlayer 195 may cover the second gate electrode 180, the third gate electrode 175, the second gate electrode pattern 182, and the first gate electrode pattern 172 on the gate insulation layer 150, and may on the entire gate insulation layer 150. For example, the first insulating interlayer 195 may cover the second gate electrode 180, the third gate electrode 175, the second gate electrode pattern 182, and the first gate electrode pattern 172 on the gate insulation layer 150, and may be formed as a substantially uniform thickness along a profile of the second gate electrode 180, the third gate electrode 175, the second gate electrode pattern 182, and the first gate electrode pattern 172. Alternatively, the first insulating interlayer 195 may sufficiently cover the second gate electrode 180, the third gate electrode 175, the second gate electrode pattern 182, and the first gate electrode pattern 172 on the gate insulation layer 150, and may have a substantially flat upper surface without a step around the second gate electrode 180, the third gate electrode 175, the second gate electrode pattern 182, and the first gate electrode pattern 172. The first insulating interlayer 195 may be formed using silicon compound, metal oxide, etc.

A first electrode pattern 232 may be formed in the third region 30 on the first insulating interlayer 195. The first electrode pattern 232 may be formed using a metal, an alloy of a metal, metal nitride, conductive metal oxide, transparent conductive oxide, etc. These may be used alone or in a suitable combination thereof. Alternatively, the first electrode pattern 232 may have multi-layered structure.

A second insulating interlayer 205 may be formed on the first insulating interlayer 195 and the first electrode pattern 232. The second insulating interlayer 205 may cover the first electrode pattern 232 on the first insulating interlayer 195, and may be formed on the entire first insulating interlayer 195. For example, the second insulating interlayer 205 may cover the first electrode pattern 232 on the first insulating interlayer 195, and may be formed as a substantially uniform thickness along a profile of the first electrode pattern 232. Alternatively, the second insulating interlayer 205 may sufficiently cover the first electrode pattern 232 on the first insulating interlayer 195, and may have a substantially flat upper surface without a step around the first electrode pattern 232. The second insulating interlayer 205 may be formed using silicon compound, metal oxide, etc.

Figure 14:
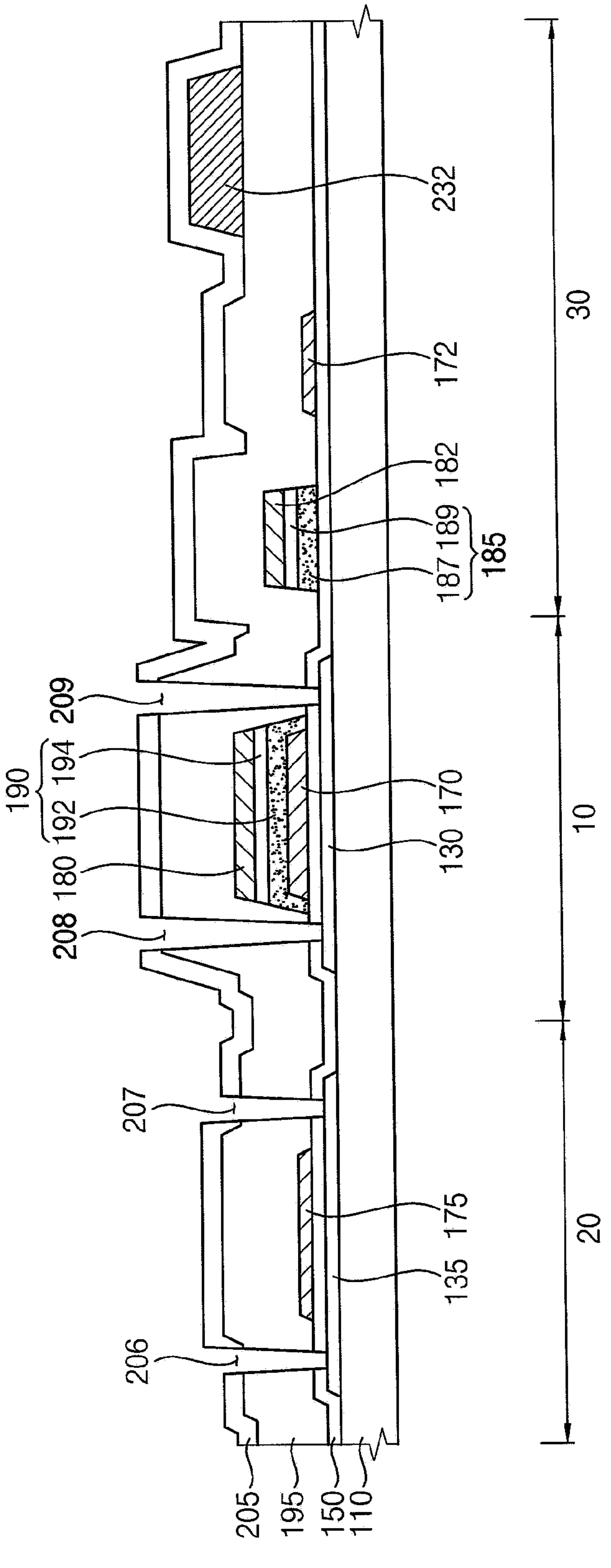

Referring to FIG. 14, a first contact hole 208 may be formed by removing a first portion of the second insulating interlayer 205, the first insulating interlayer 195, and the gate insulation layer 150, and the first contact hole 208 may expose a source region of the first active layer 130. In addition, a second contact hole 209 may be formed by removing a second portion of the second insulating interlayer 205, the first insulating interlayer 195, and the gate insulation layer 150, and the second contact hole 209 may expose a drain region of the first active layer 130.

A third contact hole 206 may be formed by removing a third portion of the second insulating interlayer 205, the first insulating interlayer 195, and the gate insulation layer 150, and the third contact hole 206 may expose a source region of the second active layer 135. In addition, a fourth contact hole 207 may be formed by removing a fourth portion of the second insulating interlayer 205, the first insulating interlayer 195, and the gate insulation layer 150, and the fourth contact hole 207 may expose a drain region of the second active layer 135. The first, second, third, and fourth contact holes 208, 209, 206, and 207 may be etched using fluorine (F) gas.

For example, when the first, second, third, and fourth contact holes 208, 209, 206, and 207 are formed by removing the preliminary high-k insulation structure 1190 together with the second insulating interlayer 205 and the first insulating interlayer 195 after the preliminary high-k insulation structure 1190 is formed on the entire gate insulation layer 150, an etching process may be performed using $BCl_2$ gas or $Cl_2$ gas due to the preliminary first high-k insulation layer 191. In this case, a defect of the contact hole may occur because of a low selectivity ratio of the first active layer 130, the gate insulation layer 150, and the preliminary high-k insulation structure 1190. In other words, the first active layer 130 may not be exposed or may be completely removed in the etching process for forming the first, second, third, and fourth contact holes 208, 209, 206, and 207. Accordingly, to readily form the first, second, third, and fourth contact holes 208, 209, 206, and 207, the first high-k insulation structure 190 and the second high-k insulation structure 185 may be spaced apart from the first, second, third, and fourth contact holes 208, 209, 206, and 207 such that the first high-k insulation structure 190 and the second high-k insulation structure 185 are not removed in a process for the first, second, third, and fourth contact holes 208, 209, 206, and 207. That is, the first high-k insulation structure 190 and the second high-k insulation structure 185 may be spaced apart from the first source and first drain electrodes 210 and 230 and the second source and second drain electrodes 215 and 235.

In exemplary embodiments, since the first high-k insulation structure 190 and the second high-k insulation structure 185 are not removed in a process for the first, second, third, and fourth contact holes 208, 209, 206, and 207 (e.g., only the second insulating interlayer 205, the first insulating interlayer 195, and the gate insulation layer 150 are removed), the first, second, third, and fourth contact holes 208, 209, 206, and 207 may be readily formed.

Figure 15:
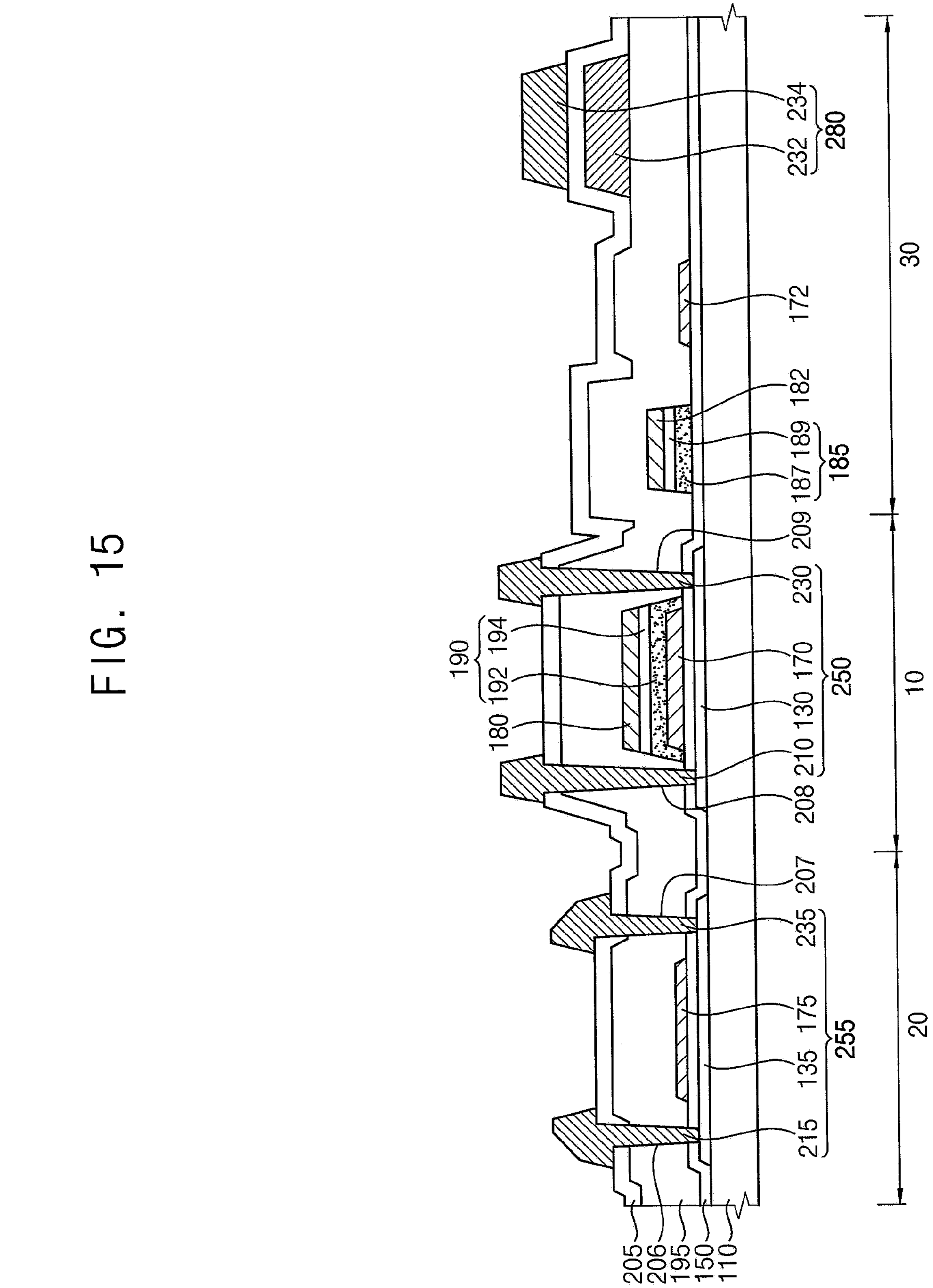

Referring to FIG. 15, a first source electrode 210 and a first drain electrode 230 may be formed in the first region 10 on the second insulating interlayer 205. The first source electrode 210 may be in direct contact with the source region of the first active layer 130 via the first contact hole 208. The first drain electrode 230 may be in direct contact with the drain region of the first active layer 130 via the second contact hole 209. Each of the first source electrode 210 and the first drain electrode 230 may be formed using a metal, an alloy, metal nitride, conductive metal oxide, transparent conductive materials, etc. These may be used alone or in a suitable combination thereof. In some exemplary embodiments, each of the first source and first drain electrodes 210 and 230 may have a multi-layered structure. Accordingly, a first semiconductor element 250 including the first active layer 130, the first gate electrode 170, the first source electrode 210, and the first drain electrode 230 may be formed.

A second source electrode 215 and a second drain electrode 235 may be formed in the second region 20 on the second insulating interlayer 205. The second source electrode 215 may be in direct contact with the source region of the second active layer 135 via the third contact hole 206. The second drain electrode 235 may be in direct contact with the drain region of the second active layer 135 via a fourth contact hole 207. Each of the second source electrode 215 and the second drain electrode 235 may be formed using a metal, an alloy, metal nitride, conductive metal oxide, transparent conductive materials, etc. These may be used alone or in a suitable combination thereof. In some exemplary embodiments, each of the second source and second drain electrodes 215 and 235 may have a multi-layered structure. Accordingly, a second semiconductor element 255 including the second active layer 135, the third gate electrode 175, the second source electrode 215, and the second drain electrode 235 may be formed.

A second electrode pattern 234 may be formed in the third region 30 on the second insulating interlayer 205. The second electrode pattern 234 may be formed on a portion of the second insulating interlayer 205 under which the first electrode pattern 232 is located. In other words, the second electrode pattern 234 may be formed on the second insulating interlayer 205 to overlap the first electrode pattern 232, and the second electrode pattern 234 together with the first electrode pattern 232 may be defined as a second capacitor 280. The second electrode pattern 234 may be formed using a metal, a metal alloy, metal nitride, conductive metal oxide, transparent conductive materials, etc. These may be used alone or in a suitable combination thereof. Alternatively, the second electrode pattern 234 may have a multi-layered structure. In exemplary embodiments, the first source electrode 210, the first drain electrode 230, the second source electrode 215, the second drain electrode 235, and the second electrode pattern 234 may be located at the same layer, and may be simultaneously formed using the same materials. For example, after a preliminary electrode layer is formed on the entire second insulating interlayer 205, the first source electrode 210, the first drain electrode 230, the second source electrode 215, the second drain electrode 235, and the second electrode pattern 234 may be formed by selectively etching the preliminary electrode layer.

Figure 16:
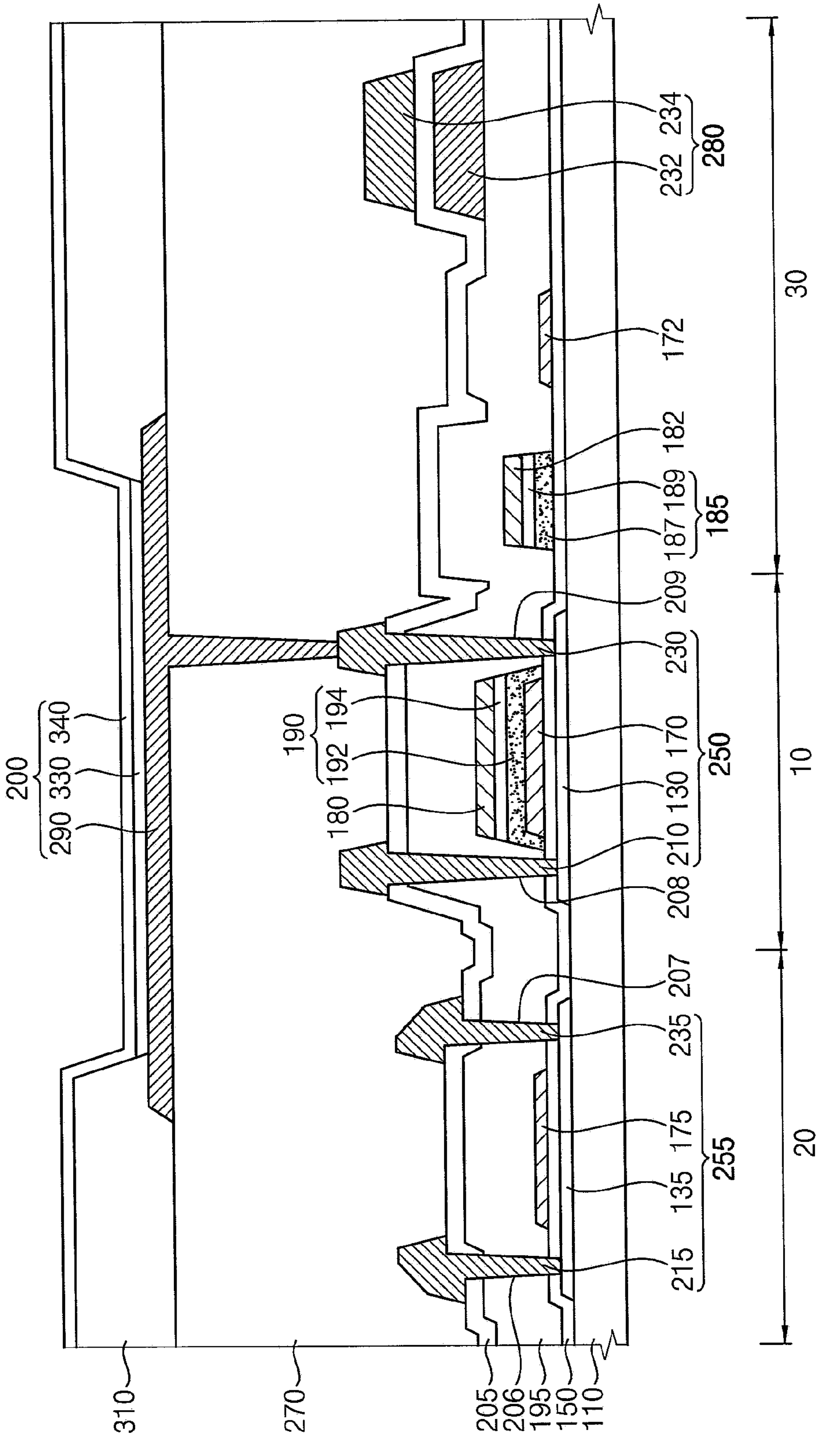

Referring to FIG. 16, a planarization layer 270 may be formed on the second insulating interlayer 205, the first source electrode 210, the first drain electrode 230, the second source electrode 215, the second drain electrode 235, and the second electrode pattern 234. The planarization layer 270 may cover the first source electrode 210, the first drain electrode 230, the second source electrode 215, the second drain electrode 235, and the second electrode pattern 234 on the second insulating interlayer 205, and may be formed on the entire second insulating interlayer 205. For example, the planarization layer 270 may be formed as a high thickness to sufficiently cover the first source electrode 210, the first drain electrode 230, the second source electrode 215, the second drain electrode 235, and the second electrode pattern 234 on the second insulating interlayer 205. In this case, the planarization layer 270 may have a substantially flat upper surface, and a planarization process may be further performed on the planarization layer 270 to implement the flat upper surface of the planarization layer 270. The planarization layer 270 may include organic materials or inorganic materials. In exemplary embodiments, the planarization layer 270 may be formed using organic materials such as an epoxy-based resin, an acryl-based resin, photoresist, a polyacryl-based resin, a polyimide-based resin, a polyamide-based resin, a siloxane-based resin, etc.

A lower electrode 290 may be formed on the planarization layer 270. The lower electrode 290 may be formed on a portion of the planarization layer 270 under which the first semiconductor element 250 is located, and may be in contact with the first drain electrode 230 via contact hole formed by removing a portion of the planarization layer 270. In addition, the lower electrode 290 may be electrically connected to the first semiconductor element 250. The lower electrode 290 may be formed using a metal, a metal alloy, metal nitride, conductive metal oxide, transparent conductive materials, etc. These may be used alone or in a suitable combination thereof. In some exemplary embodiments, the lower electrode 290 may have a multi-layered structure.

A pixel defining layer 310 may be formed on a portion of the lower electrode 290 and the planarization layer 270. The pixel defining layer 310 may cover both lateral portion of the lower electrode 290 and expose a portion of the lower electrode 290. The pixel defining layer 310 may include organic materials or inorganic materials. In exemplary embodiments, the pixel defining layer 310 may be formed using organic materials.

A light emitting layer 330 may be formed on the lower electrode 290 exposed by the pixel defining layer 310. The light emitting layer 330 may be formed using at least one of light emitting materials capable of generating different colors of light (e.g., a red color of light, a blue color of light, and a green color of light, etc) according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be formed on the light emitting layer 330 (e.g., to overlap the light emitting layer 330 on a lower surface of an encapsulation substrate). The color filter may include at least one selected from a red color filter, a green color filter, and a blue color filter. Alternatively, the color filter may include a yellow color filter, a cyan color filter, and a magenta color filter. The color filter may be formed using a photosensitive resin, etc.

An upper electrode 340 may be formed on the pixel defining layer 310 and the light emitting layer 330. The upper electrode 340 may cover the light emitting layer 330 and the pixel defining layer 310, may be formed on the entire light emitting layer 330 and the entire pixel defining layer 310. The upper electrode 340 may be formed using a metal, a metal alloy, metal nitride, conductive metal oxide, transparent conductive materials, etc. These may be used alone or in a suitable combination thereof. Alternatively, the upper electrode 340 may have a multi-layered structure. Accordingly, a light emitting structure 200 including the lower electrode 290, the light emitting layer 330, and the upper electrode 340 may be formed.

An encapsulation substrate (not shown) may be formed on the upper electrode 340. The encapsulation substrate and the substrate 110 may include substantially the same materials. For example, the encapsulation substrate may be formed using a quartz substrate, a synthetic quartz substrate, a calcium fluoride substrate, a fluoride-doped quartz substrate, a sodalime glass substrate, a non-alkali glass substrate, etc. In some exemplary embodiments, the encapsulation substrate may be formed using a transparent inorganic material or flexible plastic. For example, the encapsulation substrate may include a flexible transparent resin substrate. In this case, to increase flexibility of the OLED device, the encapsulation substrate may include a stacked structure where at least one inorganic layer and at least one organic layer are alternately stacked. Accordingly, an OLED device 100 illustrated in FIG. 1 may be manufactured.

In a method of manufacturing the OLED device 100 in accordance with exemplary embodiments, since the first high-k insulation structure 190 and the second high-k insulation structure 185 are not removed in a process for the first, second, third, and fourth contact holes 208, 209, 206, and 207, the first, second, third, and fourth contact holes 208, 209, 206, and 207 may be readily formed. Accordingly, the OLED device 100 where a defect of the first, second, third, and fourth contact holes 208, 209, 206, and 207 is not generated may be manufactured.

Figure 17:
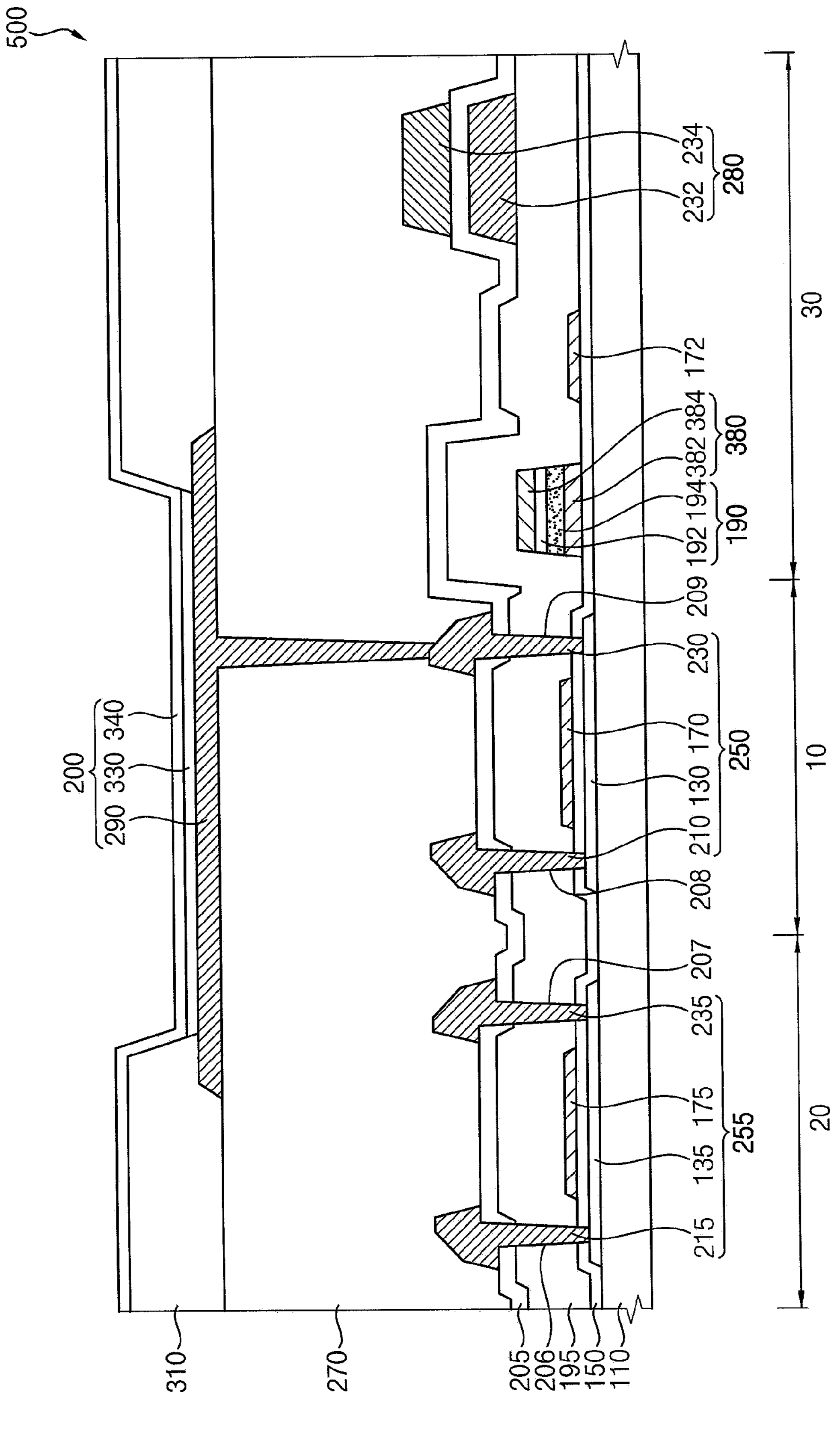
FIG. 17 is a cross-sectional view illustrating an OLED device in accordance with exemplary embodiments.

FIG. 17 is a cross-sectional view illustrating an OLED device in accordance with exemplary embodiments. An OLED device 500 illustrated in FIG. 17 may have a configuration substantially the same as or similar to that of an OLED device 100 described with reference to FIGS. 1 and 2 except for a location of a first capacitor 380. In FIG. 17, detailed descriptions for elements that are substantially the same as or similar to elements described with reference to FIGS. 1 and 2 may not be repeated.

Referring to FIG. 17, an OLED device 500 may include a substrate 110, a gate insulation layer 150, a first high-k insulation structure 190, a first semiconductor element 250, a second semiconductor element 255, a first gate electrode pattern 172, a first capacitor 380 (e.g., a storage capacitor), a first insulating interlayer 195, a light emitting structure 200, a second insulating interlayer 205, a second capacitor 280, a planarization layer 270, a pixel defining layer 310, etc. Here, the first semiconductor element 250 may include a first active layer 130, a first gate electrode 170, a first source electrode 210, and a first drain electrode 230, and the second semiconductor element 255 may include a second active layer 135, a third gate electrode 175, a second source electrode 215, and a second drain electrode 235. In addition, the first capacitor 380 may include a first conductive pattern 382 and a second conductive pattern 384, and the second capacitor 280 may include a first electrode pattern 232 and a second electrode pattern 234. Further, the first high-k insulation structure 190 may include a high-k insulation layer pattern 192 and a insulation layer pattern 194, and the light emitting structure 200 may include a lower electrode 290, a light emitting layer 330, and an upper electrode 340. Here, the term 'high dielectric constant' means that the dielectric constant K is 8 or more.

The substrate 110 may have a first region 10 (e.g., a first semiconductor element region), a second region 20 (e.g., a second semiconductor element region), and a third region 30 (e.g., a capacitor region). For example, the second region 20 may be located between the first region 10 and the third region 30, and the first region 10 may be spaced apart from the third region 30.

The first semiconductor element 250 including the first active layer 130, the first gate electrode 170, the first source electrode 210, and the first drain electrode 230 may be disposed in the first region 10 on the substrate 110. For example, the first semiconductor element 250 may serve as a switching transistor. In exemplary embodiments, the first gate electrode 170 may have a first thickness T1.

The second semiconductor element 255 including the second active layer 135, the third gate electrode third gate electrode 175, the second source electrode 215, and the second drain electrode 235 may be disposed in the second region 20 on the substrate 110. For example, the second semiconductor element 255 may serve as a driving transistor. In exemplary embodiments, the third gate electrode 175 may have the first thickness T1.

The first capacitor 380 including the first conductive pattern 382 and the second conductive pattern 384 may be disposed in the third region 30 on the substrate 110. For example, the first capacitor 380 may serve a storage capacitor.

The first high-k insulation structure 190 may be interposed between the first conductive pattern 382 and the second conductive pattern 384. In exemplary embodiments, the first high-k insulation structure 190 may be disposed only in an upper surface of the first conductive pattern 382.

For example, the first high-k insulation structure 190 may include the first high-k insulation layer pattern 192 and the first insulation layer pattern 194. Here, the first high-k insulation layer pattern 192 may be in direct contact with the first conductive pattern 382, and the first insulation layer pattern 194 may be in contact with the second conductive pattern 384.

Figure 18:
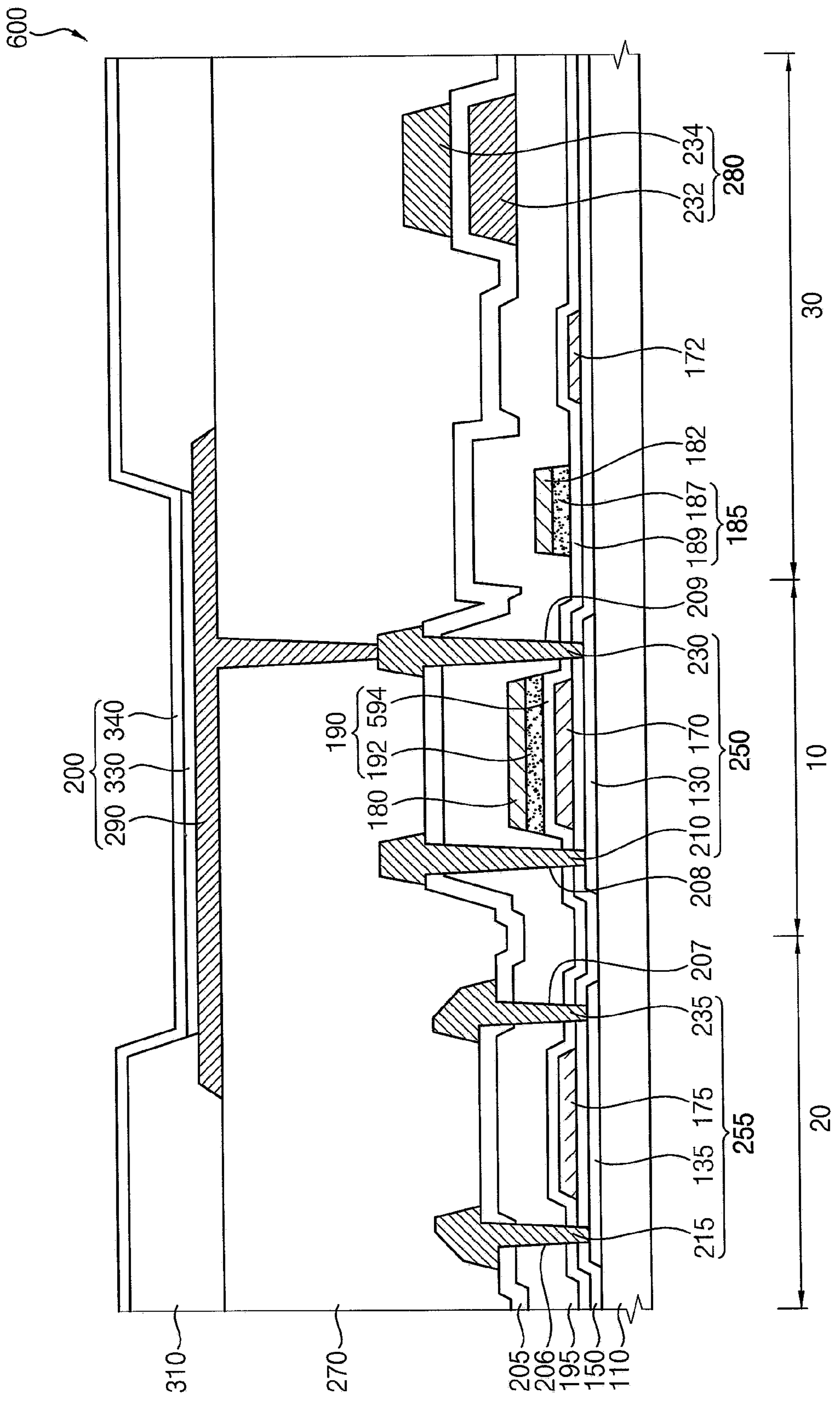
FIG. 18 is a cross-sectional view illustrating an OLED device in accordance with exemplary embodiments.
Figure 19:
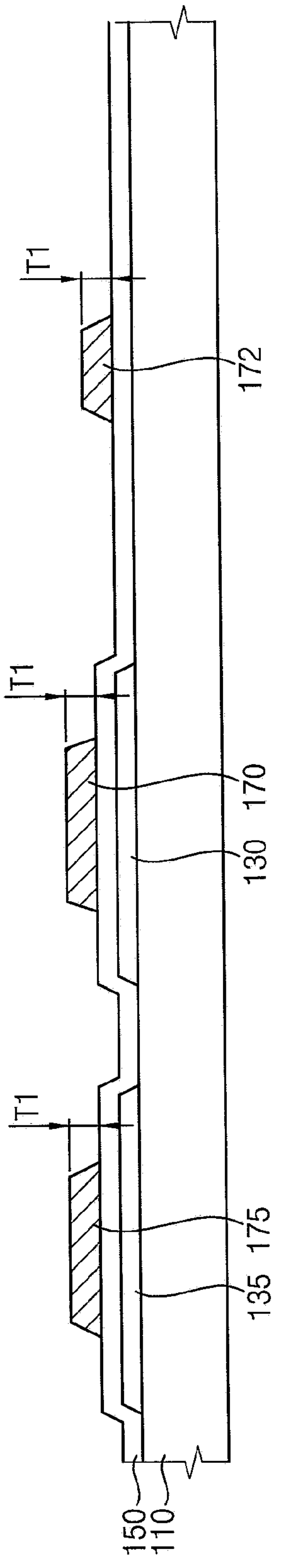
FIG. 19 is a cross-sectional view for describing a thickness of each of a first gate electrode, a third gate electrode, and a first gate electrode pattern of FIG. 18.

FIG. 18 is a cross-sectional view illustrating an OLED device in accordance with exemplary embodiments, and FIG. 19 is a cross-sectional view for describing a thickness of each of a first gate electrode, a third gate electrode, and a first gate electrode pattern of FIG. 18. An OLED device 600 illustrated in FIG. 18 may have a configuration substantially the same as or similar to that of an OLED device described with reference to FIG. 4A except for a shape of a first insulation layer 594. In FIG. 18, detailed descriptions for elements that are substantially the same as or similar to elements described with reference to FIG. 4 may not be repeated.

Referring to FIG. 18, the first high-k insulation structure 190 may include a first insulation layer 594 covering a first gate electrode 170 and a first high-k insulation layer pattern 192 disposed on the first insulation layer 594. Here, the first insulation layer 594 may be in direct contact with an upper surface of the first gate electrode 170, and the first high-k insulation layer pattern 192 may be simultaneously in contact with a lower surface of a second gate electrode 180 and an upper surface of the first insulation layer 594.

In exemplary embodiments, the first insulation layer 594 may be disposed on the entire gate insulation layer 150. For example, when an etching process is performed after a preliminary high-k insulation structure 1190 and a preliminary second gate electrode layer 1180 are formed on an entire gate insulation layer 150, the preliminary second gate electrode layer 1180 and a preliminary first high-k insulation layer 191 may be selectively removed, and a preliminary insulation layer 193 (e.g., corresponding to the first insulation layer 594) may not be removed (refer to FIGS. 8 through 10). In this case, since a first gate electrode pattern 172 and a third gate electrode 175 are not etched, as illustrated in FIG. 19, a thickness (e.g., a first thickness T1) of each of the first gate electrode 170, the first gate electrode pattern 172, and the third gate electrode 175 may be the same.

In a process for forming the first, second, third, and fourth contact holes 208, 209, 206, and 207, since the first insulation layer 594 includes silicon oxide, metal oxide, etc, the first, second, third, and fourth contact holes 208, 209, 206, and 207 may be readily formed although a process where the first insulation layer 594 is etched is add.

The present invention may be applied to various display devices including an OLED device. For example, the present invention may be applied to vehicle-display device, a ship-display device, an aircraft-display device, portable communication devices, display devices for display or for information transfer, a medical-display device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

When the OLED device in accordance with exemplary embodiments includes the first high-k insulation structure interposed only between the first gate electrode and the second gate electrode, the first, second, third, and fourth contact holes may be readily formed because the first high-k insulation structure is not removed in a process for forming the first contact hole 208, the second contact hole.

In addition, when the first high-k insulation structure completely covers the first gate electrode, the OLED device may protect the first gate electrode in a process for etching the second gate electrode.

Further, when the OLED device includes the first high-k insulation structure, the OLED device may include the first capacitor having a high dielectric constant. Accordingly, the OLED device may serve as an OLED device including the first capacitor capable of securing a relatively large capacitance.

In a method of manufacturing the OLED device in accordance with exemplary embodiments, since the first high-k insulation structure and the second high-k insulation structure are not removed in a process for the first, second, third, and fourth contact holes, the first, second, third, and fourth contact holes may be readily formed. Accordingly, the OLED device where a defect of the first, second, third, and fourth contact holes is not generated may be manufactured.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light emitting display (OLED) device, comprising:
- a substrate comprising a first region and a second region located adjacent to the first region;
- a first active layer disposed in the first region on the substrate;
- a first gate electrode disposed on the first active layer, the first gate electrode comprising a first thickness;
- a second gate electrode disposed on the first gate electrode;
- a first source electrode and a first drain electrode disposed on the first active layer;
- a first high dielectric constant (high-k) insulation structure disposed between the first gate electrode and the second gate electrode, the first high-k insulation structure being spaced apart from the first source electrode and the first drain electrode;
- a light emitting structure disposed in the first region on the first source electrode;
- a second active layer disposed in the second region on the substrate;
- a third gate electrode disposed on the second active layer, the third gate electrode having a second thickness less than the first thickness; and
- a second source electrode and a second drain electrode disposed on the second active layer, wherein:

the first high-k insulation structure comprises a first high-k insulation layer pattern and a first insulation layer pattern that are not in contact with the first source electrode and are not in contact with the first drain electrode; and the first gate electrode and the third gate electrode are located at a same layer.

2. The OLED device of claim 1, wherein the first high-k insulation structure covers the first gate electrode.

3. The OLED device of claim 1, wherein the first high-k insulation structure is disposed only on an upper surface of the first gate electrode.

4. The OLED device of claim 1, wherein the first high-k insulation layer pattern is in contact with an upper surface of the first gate electrode, the first high-k insulation layer pattern being spaced apart from a lower surface of the second gate electrode; and the first insulation layer pattern is simultaneously in contact with the lower surface of the second gate electrode and an upper surface of the first high-k insulation layer pattern, the first insulation layer pattern having a low dielectric constant less than the first high-k insulation layer pattern.

5. The OLED device of claim 1, wherein the first high-k insulation layer pattern is in contact with a lower surface of the second gate electrode; and the first insulation layer pattern is simultaneously in contact with an upper surface of the first gate electrode and a lower surface of the first high-k insulation layer pattern, the first insulation layer pattern having a low dielectric constant less than the first high-k insulation layer pattern.

6. The OLED device of claim 1, further comprising:

a second active layer disposed in the second region on the substrate;

a third gate electrode disposed on the second active layer, the third gate electrode comprising a second thickness which is less than the first thickness; and a second source electrode and a second drain electrode.

7. The OLED device of claim 1, wherein the substrate further comprises:

a third region spaced apart from the second region, the third region being located adjacent to the first region, wherein the OLED device further comprises:

a first gate electrode pattern disposed in the third region on the substrate, the first gate electrode pattern having a second thickness, which is less than the first thickness;

a second gate electrode pattern spaced apart from the first gate electrode pattern in the third region on the substrate; and a second high-k insulation structure overlapping under the second electrode pattern.

8. The OLED device of claim 7, wherein the first gate electrode and the first gate electrode pattern are located at a same layer, and the second gate electrode and the second gate electrode pattern are located at a same layer.

9. The OLED device of claim 8, wherein the second high-k insulation structure comprises:

a second high-k insulation layer pattern disposed adjacent to the substrate; and a second insulation layer pattern disposed on the second high-k insulation layer pattern.

10. The OLED device of claim 1, wherein the first gate electrode, the second gate electrode, and the first high-k insulation structure are defined as a first capacitor.

11. The OLED device of claim 1, further comprising:

a gate insulation layer interposed between the first active layer and the gate electrode;

a first insulating interlayer disposed on the second gate electrode; and a second insulating interlayer interposed between the first insulating interlayer and the first source electrode and the first drain electrode.

12. The OLED device of claim 11, wherein the first insulating interlayer comprises:

a first contact hole exposing a first portion of the first active layer such that the first source electrode is in contact with the first active layer; and a second contact hole exposing a second portion of the active layer such that the first drain electrode is in contact with the first active layer, the second portion being spaced apart from the first portion.

13. The OLED device of claim 12, further comprising:

a first electrode pattern interposed between the first insulating interlayer and the second insulating interlayer on the substrate; and a second electrode pattern disposed to overlap the first electrode pattern on the second insulating interlayer, wherein the second electrode pattern together with the first electrode pattern define a second capacitor.

14. The OLED device of claim 1, wherein the light emitting structure comprises:

a light emitting layer disposed on the lower electrode; and lower electrode disposed on the first semiconductor element;

an upper electrode disposed on the light emitting layer.

15. A method of manufacturing an OLED device, the method comprising:

providing a substrate having a first region, and a second region that is located adjacent to the first region;

forming a first active layer in the first region on the substrate;

forming a second active layer in the second region on the substrate;

forming a first gate electrode on the first active layer;

forming a third gate electrode on the second active layer, the first gate electrode and the third gate electrode having a first thickness;

forming a preliminary high-k insulation structure on the entire substrate such that the first gate electrode and the third gate electrode are covered;

forming a preliminary second gate electrode layer on the entire preliminary high-k insulation structure;

forming a second gate electrode on the first gate electrode, a first high-k insulation structure interposed between the first gate electrode and second gate electrode, and a third gate electrode having a second thickness, which is less than a first thickness, by selectively etching the preliminary second electrode layer and the preliminary high-k insulation structure;

forming a first insulating interlayer on the second gate electrode;

forming a second insulating interlayer on the first insulating interlayer;

forming a first contact hole exposing a first portion of the first active layer by removing a first portion of both the first insulating interlayer and the second insulating interlayer;

forming a second contact hole exposing a second portion of the first active layer by removing a second portion of both the first insulating interlayer and the second insulating interlayer; and forming a light emitting structure on the second gate electrode, wherein the first high-k insulation structure is spaced apart from the first and second contact holes.

16. The method of claim 15, wherein the first high-k insulation structure covers the first gate electrode.

17. The method of claim 15, wherein the first high-k insulation structure comprises:

a first high-k insulation layer pattern in contact with an upper surface of the first gate electrode, the first high-k insulation layer pattern being spaced apart from a lower surface of the second gate electrode; and a first insulation layer pattern simultaneously in contact with the lower surface of the second gate electrode and an upper surface of the first high-k insulation layer pattern, the first insulation layer pattern having a low dielectric constant less than the first high-k insulation layer pattern.

* * * * *